(12) United States Patent
Cornwall

(10) Patent No.: US 10,097,113 B2
(45) Date of Patent: Oct. 9, 2018

(54) APPARATUSES AND METHODS FOR PERFORMING THERMODYNAMIC CYCLES

(71) Applicant: Remi Oseri Cornwall, London (GB)

(72) Inventor: Remi Oseri Cornwall, London (GB)

(*) Notice: Subject to any disclaimer, the term of this patent is extended or adjusted under 35 U.S.C. 154(b) by 217 days.

(21) Appl. No.: 14/891,570

(22) PCT Filed: May 16, 2014

(86) PCT No.: PCT/GB2014/051504
§ 371 (c)(1),
(2) Date: Nov. 16, 2015

(87) PCT Pub. No.: WO2014/184572
PCT Pub. Date: Nov. 20, 2014

(65) Prior Publication Data
US 2016/0094159 A1    Mar. 31, 2016

(30) Foreign Application Priority Data

| May 16, 2013 | (GB) | 1308877.8 |
| Jul. 15, 2013 | (GB) | 1312644.6 |
| Jul. 17, 2013 | (GB) | 1312753.5 |
| Aug. 13, 2013 | (GB) | 1314507.3 |

(51) Int. Cl.
*H02K 11/00* (2016.01)
*H01L 37/00* (2006.01)
*H01L 37/04* (2006.01)
*H02N 11/00* (2006.01)
*F25B 21/00* (2006.01)
*H02N 10/00* (2006.01)

(52) U.S. Cl.
CPC .......... *H02N 11/002* (2013.01); *F25B 21/00* (2013.01); *H01L 37/04* (2013.01); *H02N 10/00* (2013.01); *F25B 2321/0023* (2013.01); *Y02B 30/66* (2013.01)

(58) Field of Classification Search
CPC ...... H02N 11/002; H02N 2/181; H02N 2/185; H02N 11/00; F25B 2321/002; F25B 2321/0023; H01L 37/04
USPC .......................................... 63/3.1
See application file for complete search history.

(56) References Cited

U.S. PATENT DOCUMENTS

| 6,725,668 B1 * | 4/2004 | Cornwall | F25B 21/00 310/306 |
| 7,746,203 B2 * | 6/2010 | Cornwall | H02K 44/085 335/217 |

* cited by examiner

*Primary Examiner* — Burton Mullins
(74) *Attorney, Agent, or Firm* — Craig J. Lervick; Larkin Hoffman Daly & Lindgren, Ltd.

(57) ABSTRACT

Methods for increasing the power output from a heat engine based on temporary electrical and magnetic remanence is achieved by a means of cancelling the power limitation caused by re-magnetization fields and methods for varying the turns-ratio of the output coils as the flux decays.

18 Claims, 15 Drawing Sheets

Log Energy
$10^{-6}$ to $10^{-3}$ J per cycle

Log 1/R $10^{-4}$ to $10^4$ Siemens

Current: range 0 to 0.04A, time range: 0-5000sec on LHS to 0 to 0.04sec on RHS
Resistance 0.0001, 0.01, 1, 100, 10,000 ohms LHS to RHS Magnetisation: range 0 to 200 A/M, time range: same as current trace from LHS to RHS Log Energy $10^{-6}$ to $10^{-2}$ J per cycle Log 1/R $10^{-4}$ to $10^4$ Siemens Current: range 0 to 1.5A on LHS to 0 to $5 \times 10^{-5}$A RHS
Time range: 0-200sec on LHS to 0 to 0.04sec on RHS
Resistance 0.0001, 0.01, 1, 100, 10,000 ohms LHS to RHS Magnetisation: range 0 to 200 A/M,
Time range: same as current trace LHS circuit potential divider RHS circuit potential divider $$V_{ff} + V_{M.rhs} = -\frac{d\lambda_{ff}}{dt} + M_{rhs}\frac{di_{rhs}}{dt}$$

Figure 14B – Non-linear measure #1 N(i,t)

Figure 14C – Non-linear measure #2 R(i,t)
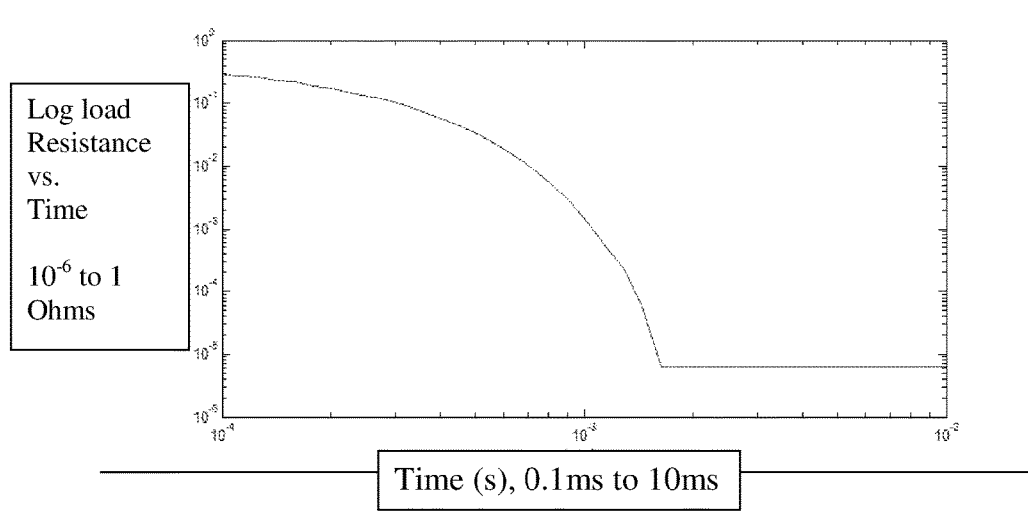
Log load Resistance vs. Time
$10^{-6}$ to 1 Ohms
Time (s), 0.1ms to 10ms
Figure 14D – Current and Magnetisation waveforms
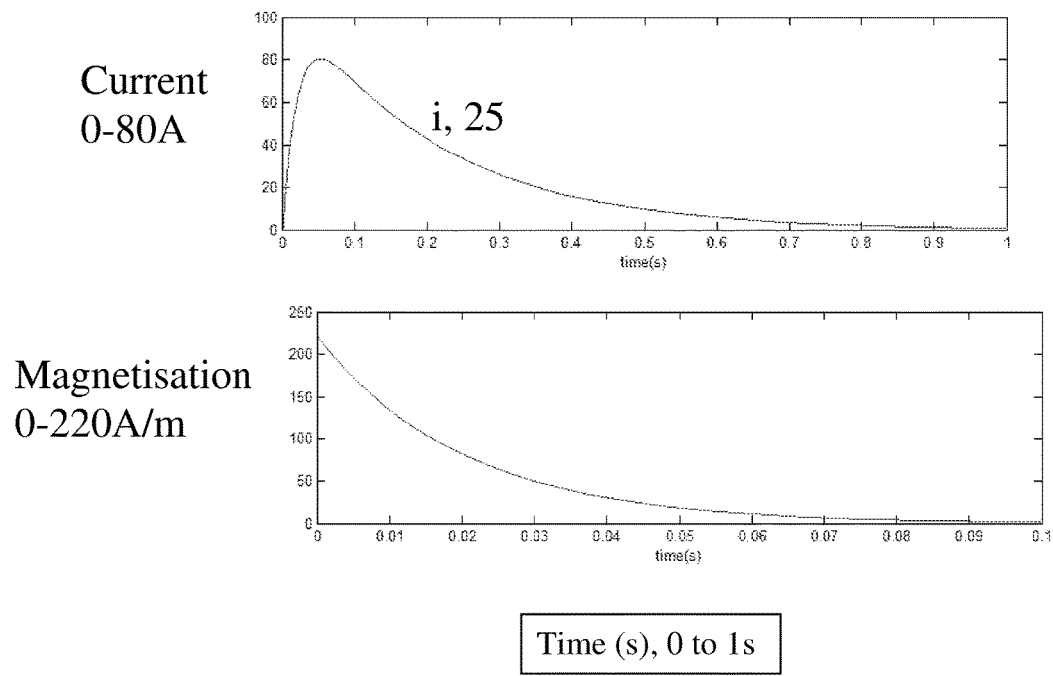
Current 0-80A
i, 25
Magnetisation 0-220A/m
Time (s), 0 to 1s

APPARATUSES AND METHODS FOR PERFORMING THERMODYNAMIC CYCLES

FIELD

The disclosed technology relates to thermodynamic cycles, and in particular relates to improved power collection schemes from the collapse of magnetic fluxes in a sample for certain types of thermodynamic cycles.

BACKGROUND

It has previously been proposed to use a sample having temporary magnetic remanence to perform a thermodynamic cycle in which a varying magnetic field is used to produce a magnetic flux in the sample during a first part of the cycle, with the field being removed during a second part of the cycle, leading to collapse of the magnetic domains in the sample and the creation of an independent magnetic flux. It has been proposed to use this principle to convert heat energy into electricity, and also for refrigeration.

An example of a system of this type is described in International Publication No. WO 00/64038 entitled "Thermodynamic Cycles and Method for Generating Electricity" and filed Apr. 19, 2000. Described in WO 00/64038, energy is recovered from the sample once per cycle of the excitation field. In a first step of the cycle, the sample is magnetized, with very little corresponding temperature rise, as the sample is far from the ferromagnetic phase transition point of the sample. The sample is then demagenetized by the removal of the field from the sample, after which the temperature of the sample falls as thermal energy within the sample is expended in working to re-randomize the domains in the sample against the field arising from the remnant magnetism of the sample. After a short time, heat from the surroundings warms the sample, and the magnetic domains within the sample become randomly oriented, and this leads to the generation of an independent magnetic flux as the magnetic field arising from the alignment of the magnetic domains collapses. This independent magnetic flux delivers power to the field generation apparatus.

SUMMARY

Disclosed below are representative embodiments of methods, apparatus, and systems that should not be construed as limiting in any way. Instead, the present disclosure is directed toward all novel and non-obvious features and aspects of the various disclosed methods, apparatus, systems, and equivalents thereof, alone and in various combinations and sub-combinations with one another. The present disclosure is not limited to any specific aspect or feature, or combination thereof, nor do the disclosed methods, apparatus, and systems require that any one or more specific advantages be present or problems be solved.

In one exemplary embodiment of the disclosed technology, an apparatus for performing a thermodynamic cycle is disclosed. The exemplary apparatus comprises: a sample that exhibits temporary magnetic remanence; and a magnetization apparatus for magnetizing the sample, wherein the magnetization apparatus is operable, during a first part of the thermodynamic cycle, to produce a cyclically-varying magnetizing field comprising a wavetrain of a single or plurality of consecutive cycles, and to remove the magnetizing field from the sample during a second part of the thermodynamic cycle, wherein demagnetization of the sample during the second part of the thermodynamic cycle causes the generation of an independent magnetic flux.

In another exemplary embodiment of the disclosed technology, an apparatus for performing a thermodynamic cycle is disclosed. The exemplary apparatus comprises: a sample that exhibits temporary electrical remanence; and a polarizing apparatus for polarizing the sample, wherein the polarizing apparatus is operable, during a first part of the thermodynamic cycle, to produce a cyclically-varying electrical field comprising a wavetrain of a single or plurality of consecutive cycles, and to remove the electrical field from the sample during a second part of the thermodynamic cycle, wherein depolarization of the sample during the second part of the thermodynamic cycle causes the generation of an independent electric flux and a transient independent magnetic flux associated with the changing independent electric flux.

In certain desirable embodiments, the periodically-varying magnetizing field is a substantially unipolar or bipolar sinusoidal or half sawtoothed or pulse varying magnetizing field. Preferably, the magnetizing field produces a substantially exponentially-decaying remnant magnetic flux in the sample. The sample can be, for example, a ferrofluid, a ferroset slurry or a ferroset with heat conduction channels therethrough. In some embodiments, the wavetrain comprises at least five consecutive cycles of the magnetizing field (e.g., at least ten consecutive cycles of the magnetizing field). In certain embodiments, the magnetization apparatus also comprises a power collection apparatus, in which power is generated during the second part of the thermodynamic cycle by the independent magnetic flux.

In other certain desirable embodiments, the periodically-varying electric field is a substantially unipolar or bipolar sinusoidal or half sawtoothed or pulse varying polarizing field. Preferably, the polarizing field produces a substantially exponentially-decaying remnant electric flux in the sample. The sample can be, for example, an electret with heat conduction channels therethrough. In some embodiments, the wavetrain comprises at least five consecutive cycles of the polarizing field (e.g., at least ten consecutive cycles of the polarizing field). In certain embodiments, the polarizing apparatus also comprises a power collection apparatus, in which power is generated during the second part of the thermodynamic cycle by the independent electric flux or a transient magnetic field resulting from the independent electric flux.

In another exemplary embodiment, a method of converting energy is disclosed. The exemplary comprises: providing a sample that exhibits temporary magnetic remanence; magnetizing the sample, during a first part of a thermodynamic cycle, by producing a cyclically-varying magnetizing field comprising a wavetrain of a plurality of consecutive cycles; and removing the magnetizing field from the sample during a second part of the thermodynamic cycle, thereby allowing the sample to demagnetize, the demagnetization of the sample causing the generation of an independent magnetic flux. In certain embodiments, the method further comprises the step of converting at least some of the independent magnetic flux into an electric current.

In another exemplary embodiment, a method of converting energy is disclosed. The exemplary comprises: providing a sample that exhibits temporary electrical remanence; polarizing the sample, during a first part of a thermodynamic cycle, by producing a cyclically-varying polarizing field comprising a wavetrain of a plurality of consecutive cycles; and removing the polarizing field from the sample during a second part of the thermodynamic cycle, thereby allowing the sample to depolarize, the depolarizing of the sample causing the generation of an independent electric field. In certain embodiments, the method further comprises the step of converting at least some of the independent electric flux into an electric current.

In another exemplary embodiment, a method of converting energy is disclosed. The exemplary comprises: providing a sample that exhibits temporary electrical remanence; polarizing the sample, during a first part of a thermodynamic cycle, by producing a cyclically-varying polarizing field comprising a wavetrain of a plurality of consecutive cycles; and removing the polarizing field from the sample during a second part of the thermodynamic cycle, thereby allowing the sample to depolarize, the depolarizing of the sample causing the generation of an independent electric field and by Maxwell's equations, a magnetic field. In certain embodiments, the method further comprises the step of converting at least some of the transient independent magnetic flux into an electric current.

In another exemplary embodiment, an apparatus for performing a thermodynamic cycle is disclosed comprising: a sample that exhibits temporary magnetic remanence; and a magnetization apparatus for magnetizing the sample, wherein the magnetization apparatus is operable, during a first part of the thermodynamic cycle, to produce a substantially periodically-varying magnetizing field that is substantially unipolar or bipolar sinusoidal or half sawtoothed or pulse varying, thus producing a substantially unipolar or bipolar sinusoidal or half sawtoothed magnetic flux in the sample with a decaying exponential element at the discontinuities, and to remove the magnetizing field from the sample during a second part of the thermodynamic cycle, wherein demagnetization of the sample during the second part of the thermodynamic cycle causes the generation of an independent magnetic flux. The sample can be, for example, a ferrofluid or a ferro set with heat conduction channels therethrough.

In a further exemplary embodiment, another method for converting energy is disclosed. The exemplary method comprises: providing a sample that exhibits temporary magnetic remanence; magnetizing the sample, during a first part of a thermodynamic cycle, by producing a substantially unipolar or bipolar sinusoidal or half sawtoothed or pulse varying field, thus producing a substantially unipolar or bipolar sinusoidal or half sawtoothed magnetic flux in the sample with a decaying exponential element at the discontinuities; and removing the magnetizing field from the sample during a second part of the thermodynamic cycle, thereby allowing the sample to demagnetize, the demagnetization of the sample causing the generation of an independent magnetic flux. In certain embodiments, the method further comprises the step of converting at least some of the independent magnetic flux into an electric current.

In another exemplary embodiment, an apparatus for performing a thermodynamic cycle is disclosed comprising: a sample that exhibits temporary electric remanence; and a polarizing apparatus for polarizing the sample, wherein the polarization apparatus is operable, during a first part of the thermodynamic cycle, to produce a substantially periodically-varying polarizing field that is a substantially unipolar or bipolar sinusoidal or half sawtoothed or pulse varying field, thus producing a substantially unipolar or bipolar sinusoidal or half sawtoothed electric flux in the sample with a decaying exponential element at the discontinuities, and to remove the polarizing field from the sample during a second part of the thermodynamic cycle, wherein depolarization of the sample during the second part of the thermodynamic cycle causes the generation of an independent electric flux. The sample can be, for example, a ferro set with heat conduction channels therethrough or a plurality of ferrosets suspended in a non-conductive fluid.

In a further exemplary embodiment, another method for converting energy is disclosed. The exemplary method comprises: providing a sample that exhibits temporary electric remanence; polarizing the sample, during a first part of a thermodynamic cycle, by producing a substantially unipolar or bipolar sinusoidal or half sawtoothed or pulse varying field, thus producing a substantially unipolar or bipolar sinusoidal or half sawtoothed electric flux in the sample with a decaying exponential element at the discontinuities; and removing the polarizing field from the sample during a second part of the thermodynamic cycle, thereby allowing the sample to depolarize, the depolarization of the sample causing the generation of an independent electric flux or transient magnetic flux resulting from the changing electric flux. In certain embodiments, the method further comprises the step of converting at least some of the independent electric flux or transient magnetic flux resulting from the changing electric flux into an electric current.

In a further exemplary embodiment, another method for converting energy is disclosed. The exemplary method comprises: providing a sample that exhibits temporary magnetic remanence; magnetizing the sample, during a first part of a thermodynamic cycle, by producing a substantially unipolar or bipolar sinusoidal or half sawtoothed or pulse varying field, thus producing a substantially unipolar or bipolar sinusoidal or half sawtoothed magnetic flux in the sample with a decaying exponential element at the discontinuities; and removing the magnetizing field from the sample during a second part of the thermodynamic cycle, thereby allowing the sample to demagnetize, the demagnetization of the sample causing the generation of an independent magnetic flux. In certain embodiments, the method further comprises the step of converting at least some of the independent magnetic flux into an electric current by superimposing a chopped, inverted copy of the induced current, at a frequency higher than the relaxation rate of the flux remanence, to cancel the re-magnetizing field from the induced current to achieve higher output power.

In a further exemplary embodiment, another method for converting energy is disclosed. The exemplary method comprises: providing a sample that exhibits temporary magnetic remanence; magnetizing the sample, during a first part of a thermodynamic cycle, by producing a substantially unipolar orbipolar sinusoidal or half sawtoothed or pulse varying field, thus producing a substantially unipolar or bipolar sinusoidal or half sawtoothed magnetic flux in the sample with a decaying exponential element at the discontinuities; and removing the magnetizing field from the sample during a second part of the thermodynamic cycle, thereby allowing the sample to demagnetize, the demagnetization of the sample causing the generation of an independent magnetic flux. In certain embodiments, the method further comprises the step of converting at least some of the independent magnetic flux into an electric current by varying the turns-ratio of the output coil and/or the load resistance as the flux decays.

In a further exemplary embodiment, another method for converting energy is disclosed. The exemplary method comprises: providing a sample that exhibits temporary electric remanence; polarizing the sample, during a first part of a thermodynamic cycle, by producing a substantially unipolar or bipolar sinusoidal or half sawtoothed or pulse varying field, thus producing a substantially unipolar or bipolar sinusoidal or half sawtoothed electric flux in the sample with a decaying exponential element at the discontinuities; and removing the polarizing field from the sample during a second part of the thermodynamic cycle, thereby allowing the sample to depolarize, the depolarization of the sample causing the generation of an independent electric flux. In certain embodiments, the method further comprises the step of converting at least some of the independent electric flux into an electric current by causing the generation of a transitory independent magnetic flux from the change in the electric flux. In certain embodiments, the method further comprises the step of converting at least some of the independent magnetic flux into an electric current by superimposing a chopped, inverted copy of the induced current, at a frequency higher than the relaxation rate of the flux remanence, to cancel the re-magnetizing field from the induced current to achieve higher output power.

In a further exemplary embodiment, another method for converting energy is disclosed. The exemplary method comprises: providing a sample that exhibits temporary electric remanence; polarizing the sample, during a first part of a thermodynamic cycle, by producing a substantially unipolar or bipolar sinusoidal or half sawtoothed or pulse varying field, thus producing a substantially unipolar or bipolar sinusoidal or half sawtoothed electric flux in the sample with a decaying exponential element at the discontinuities; and removing the polarizing field from the sample during a second part of the thermodynamic cycle, thereby allowing the sample to depolarize, the depolarization of the sample causing the generation of an independent electric flux. In certain embodiments, the method further comprises the step of converting at least some of the independent electric flux into an electric current by varying the load resistance as the flux decays.

The foregoing and other objects, features, and advantages of the invention will become more apparent from the following detailed description, which proceeds with reference to the accompanying figures.

DESCRIPTION OF THE DRAWINGS AND APPENDIX

FIG. 1 is a plant diagram [1] with heat exchanger 2, working substance 3 (ferrofluid for example), the pump 4, the power extraction area 5.

FIG. 2 shows a typical configuration of the temporary magnetic remanence device 1, the working substance 3, the co-material 6 and heat conduction holes 7 should the working substance be solid and not able to be pumped and the magnetizing coils 8 and/or the power output coils 9.

FIG. 3 shows a bipolar sinusoidal excitation waveform 10 (or plurality of as a wavetrain) and the response of the temporary remanence working substance (typically ferrofluid) 11, with the temporary remanence effect 12 after zero exciter waveform input.

FIG. 4 is a typical circuit for the bipolar sinusoidal excitation waveform with SCR/triac 13, trigger waveform 14, storage capacitor 15, electrical output load 16 and a tap from the output 17 to recharge the storage capacitor 15 with the energy and current 25 generated from the working substance 3 and co-material 6. The switch 18 is only closed when the exciter waveform 10 is off to avoid needless transformer action and power diversion of the exciter circuit into the load, so that only the dipole work from the decaying remnant flux 12 goes to the load 16.

FIG. 5 is a unipolar half-sawtooth or pulse excitation waveform 10 (or the H field) and the response of the temporary remanence working substance 12 (the magnetization M). The graph shows their combined magnetic fields summed as by $B = \mu_o (H+M)$.

FIG. 6 is a typical circuit for the unipolar half-sawtooth or pulse excitation waveform. The ramp-on is controlled by the transistor (typically) 19 which is switched by the control signal 14 (shown bipolar to switch the transistor off "hard") and the magnetizing coil's 8 inductance. A "flyback" circuit composed of a small coil around the arrangement 3, 6, 8, 9 and wound in anti-sense in series with the diode captures the field energy as the magnetizing field collapses and returns it to the storage capacitor 15.

FIG. 7 shows a graph of energy into a resistive load 21, 22 per cycle vs. 1/R along with graphs of i(t) vs. t and M(t) vs. t on the lower half of the page. The upper graph shows the linear "Faraday Law" portion 21 and the plateau phase 22 and the energy input as magnetization energy 23.

Figure 9A:
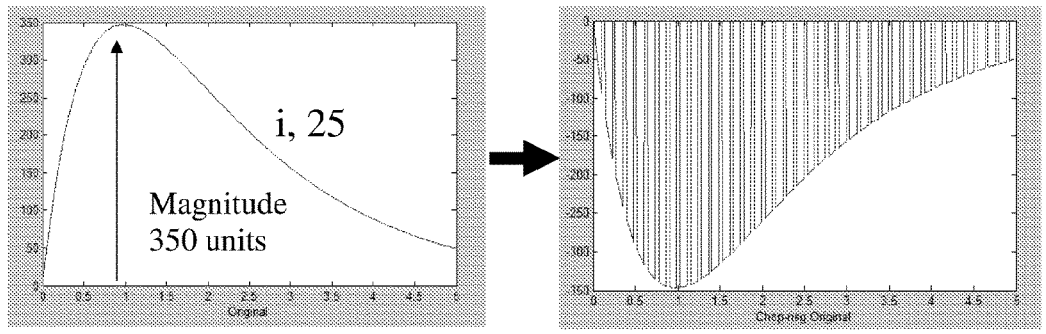
FIG. 9 shows a series of sub-figures illustrating the method of field cancellation in the time domain.

FIG. 9A shows the current 25 in the power output circuit (9, 16, 18) being copied, inverted and chopped (second sub-figure on right) to form the field cancellation current 26. This (FIG. 9B) is then added on to a copy of the current to leave a chopped positive waveform of the current (second sub-figure on right). The magnetic field from this current impinges on the working substance 3, and co-material 6 where it is lowpass filtered and due to the high frequency content from the chopping, the magnitude of the re-magnetizing field (see description) is much reduced.

Figure 9B:
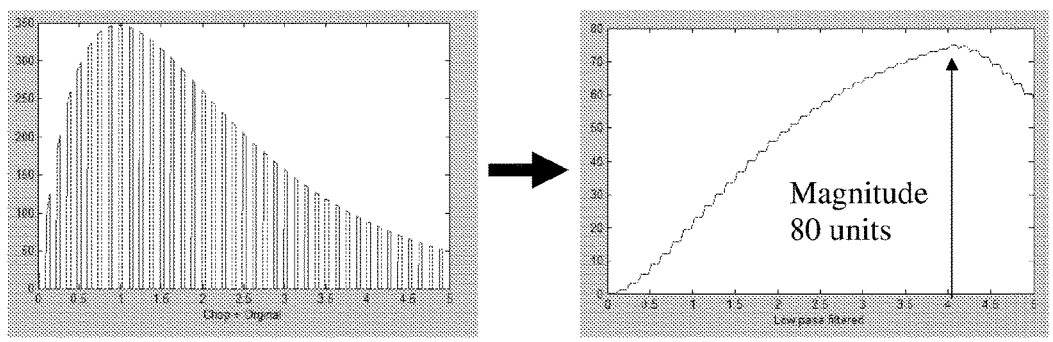
Figure 9C:
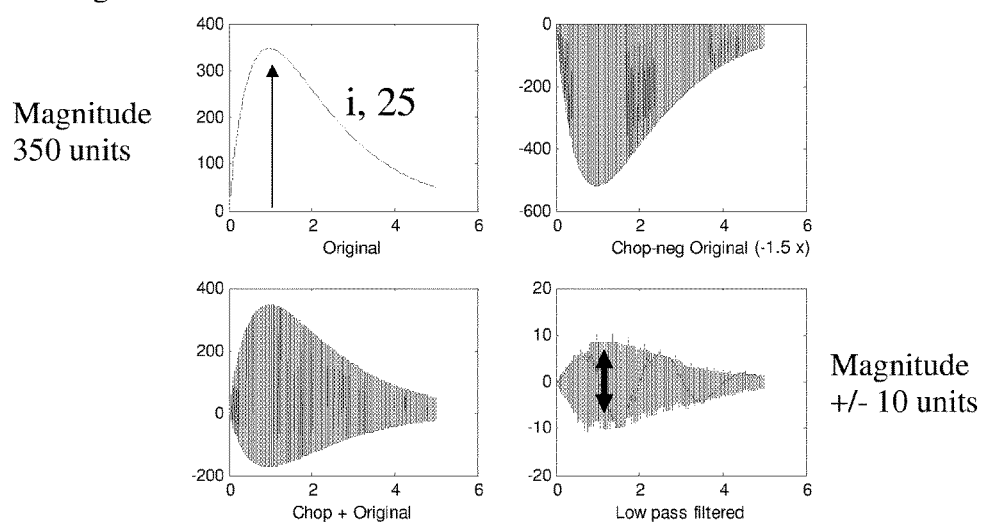

FIG. 9C shows the same scheme as FIGS. 9A and 9B (clockwise from the top left) but with a more negative copy of the current 25 and much high frequency to leave virtually no response to the re-magnetizing field.

Figure 10A:
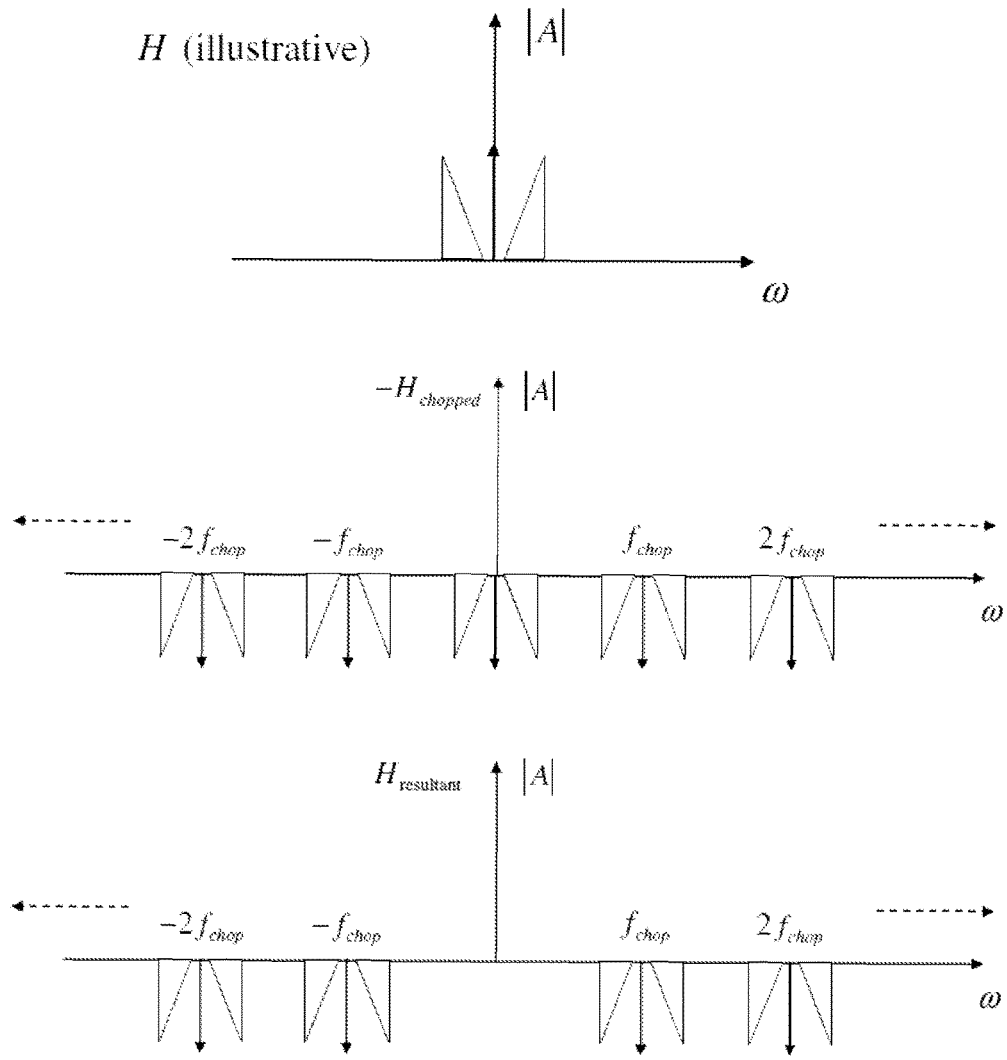
Figure 10B:
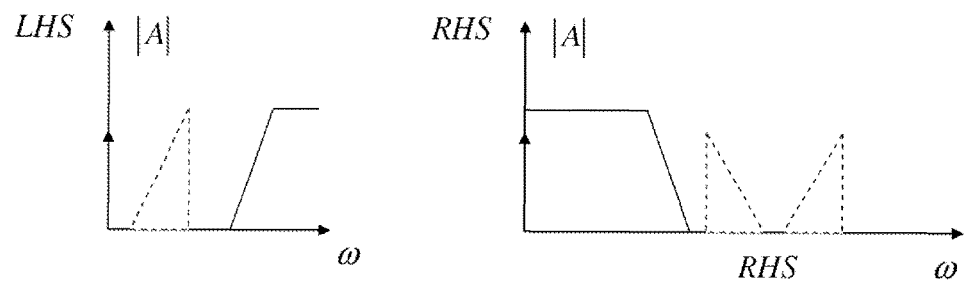

FIG. 10A shows the method of field cancellation in the frequency domain. The topmost figure shows the frequency spectrum of the current 25. The middle figure shows the spectrum of the inverted chopped signal. The lower figure shows the summation of the field from the current 25 and the field cancellation method current 26. FIG. 10B how the signals are filtered by the field cancelling and power output circuits.

Figure 11A:
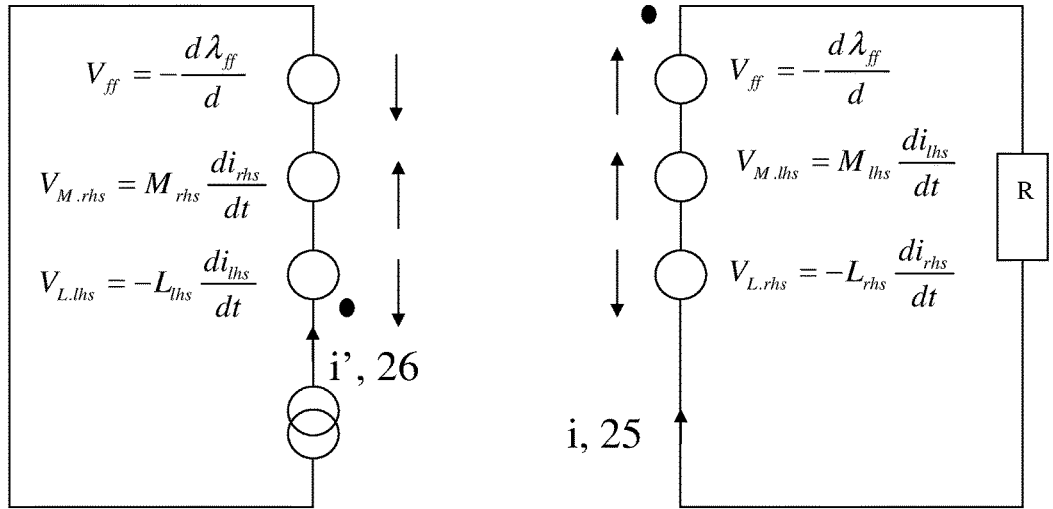

FIGS. 11A, B and C explain the field cancellation method with equivalent circuits.

Figure 8:
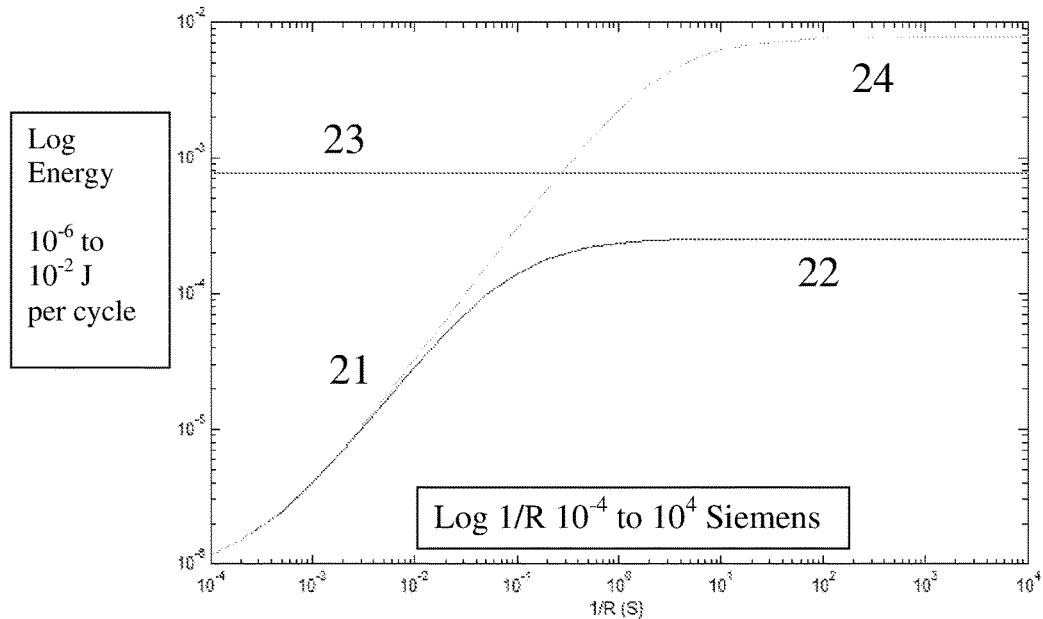
FIG. 8 shows a graph of energy into a resistive load per cycle vs. 1/R with the Field Cancellation Method along with graphs of i(t) vs. t and M(t) vs. t on the lower half of the page.
Figure 8:
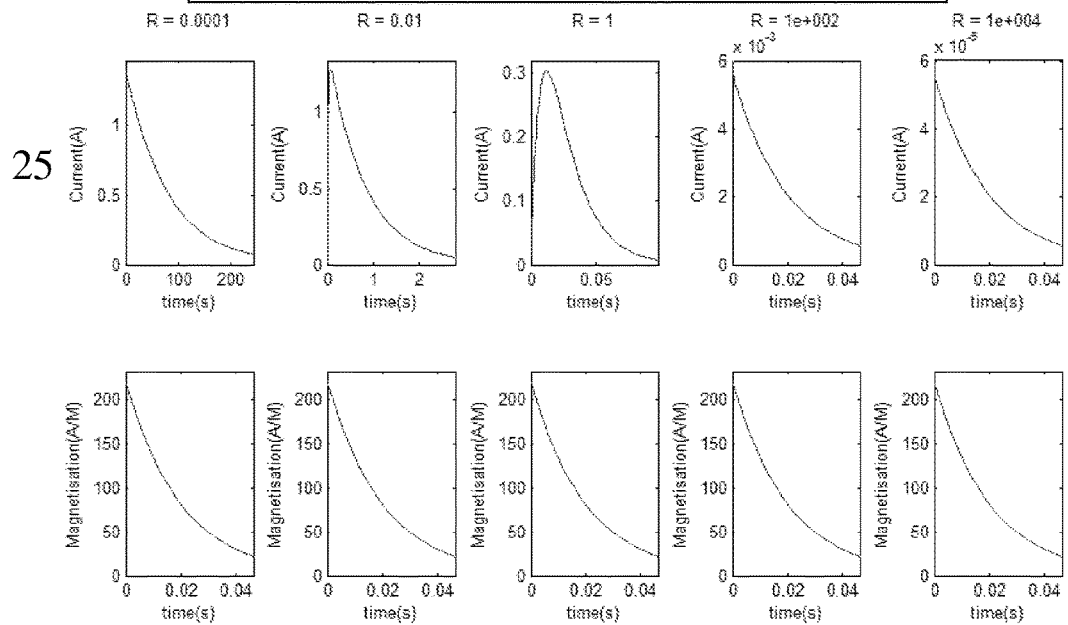
Figure 12:
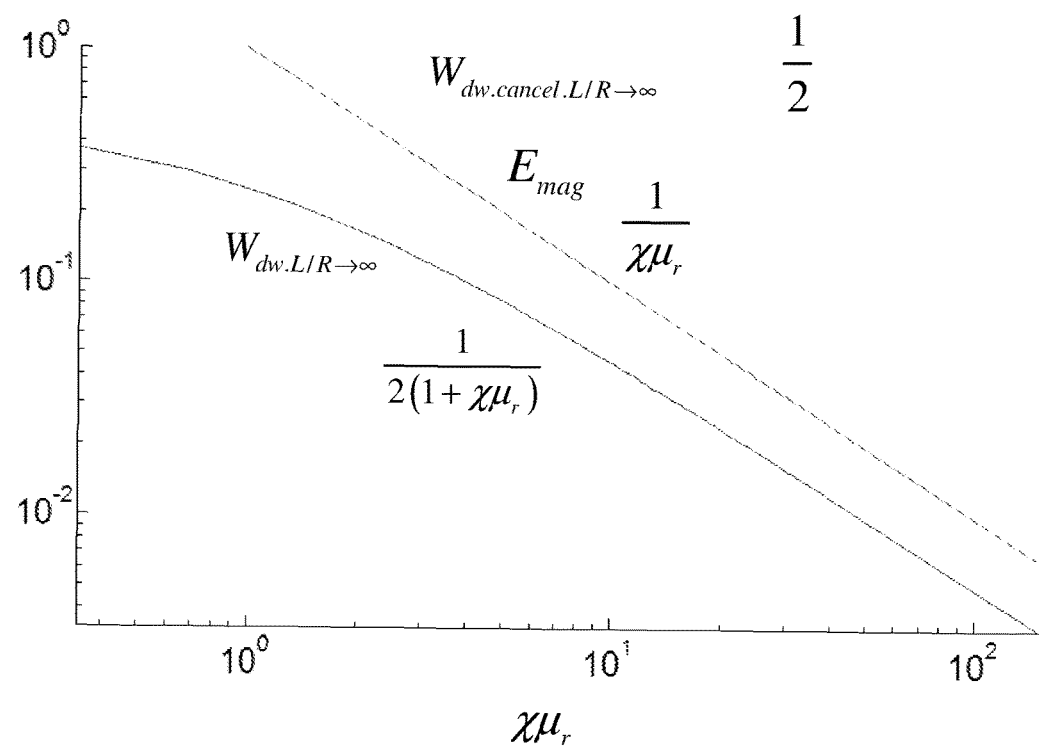

FIG. 12 shows a graph of the variation of parameters and energy output per cycle with the Field Cancellation Method at the plateau portions 22, 23 and 24 of FIG. 8.

Figure 13A:
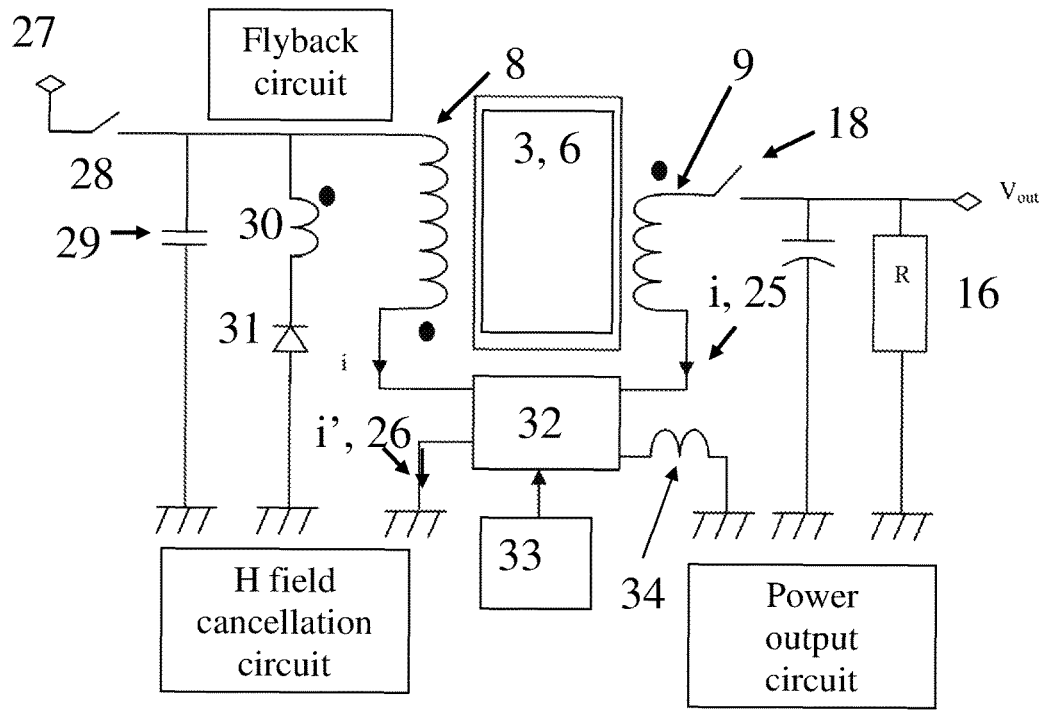

FIG. 13A shows the Field Cancellation Circuit. A high voltage source (powered ultimately by the energy obtained from the working substance) is periodically switched 28 into storage capacitor 29. A current mirror 32 copies current 25 and chops it with high frequency signal 33 to make field cancelling current 26 flow through the magnetizing coil 8 or another coil if the same coil is not desired to be used from the magnetizing part of the cycle (as opposed to the demagnetizing power step of the cycle). A flyback circuit 30, 31 makes sure that the chopping is done efficiently, i.e. regeneratively. The sum of the fields from coil 8 (now the H-field cancelling field) and coil 9 (which produces the re-magnetizing field) acts on the working substance 3 and co-material 6. A choke/inductor 34 acts to stop power being wasted from the H field cancellation circuit to the Power output circuit.

Figure 13B:
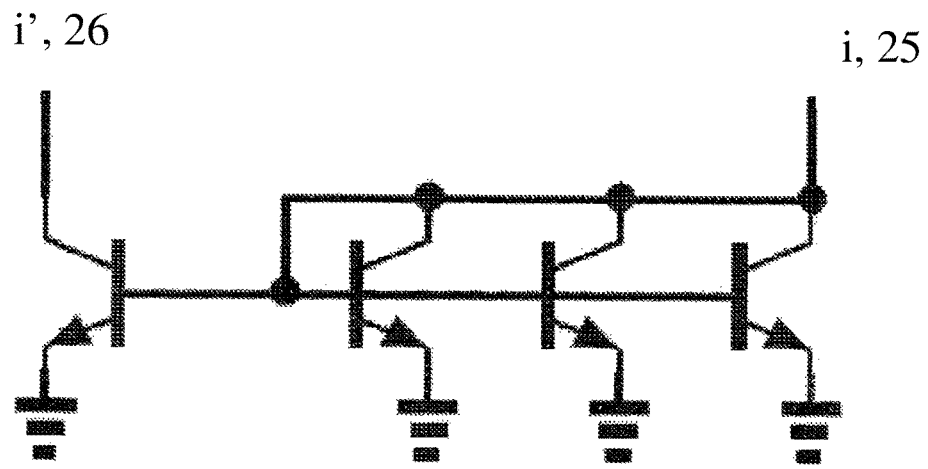

FIG. 13B an example of a current mirror made from bipolar transistors producing one third of the copied current which can be advantageous in the design of the circuit.

Figure 14A:
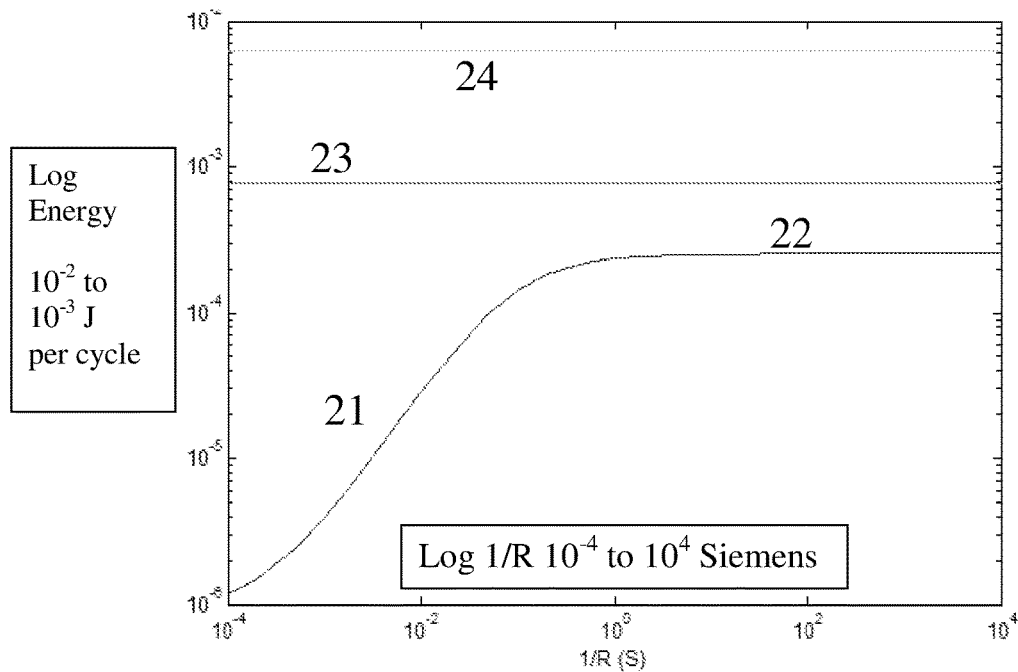
Figure 14A:
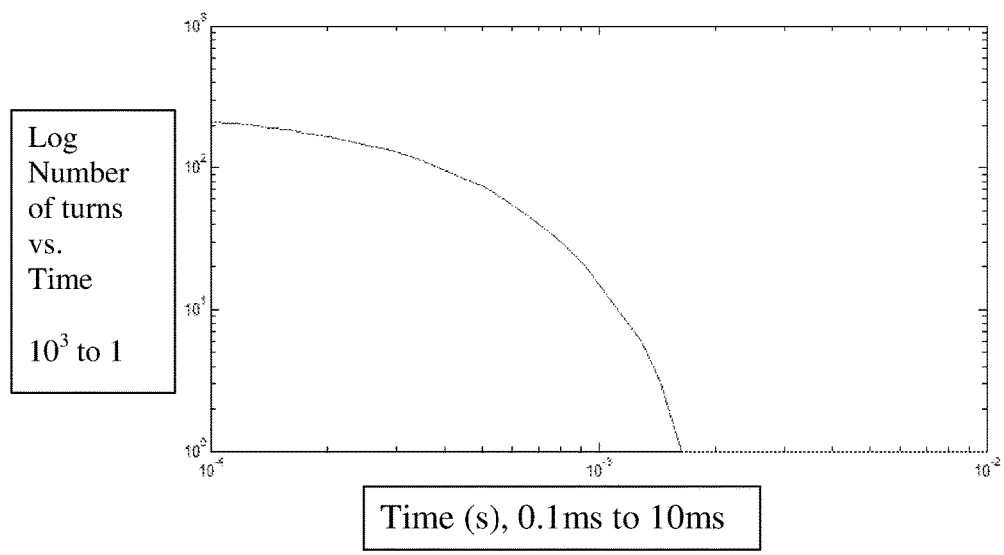

FIGS. 14A, B, C and D show the Non Linear Method and energy into a resistive load per cycle with the resistance varying over the cycle and also the turns ratio varying. FIG. 14D shows a further advantage of the method in speeding up the decay waveforms at low resistance/high inductance.

Figure 15:
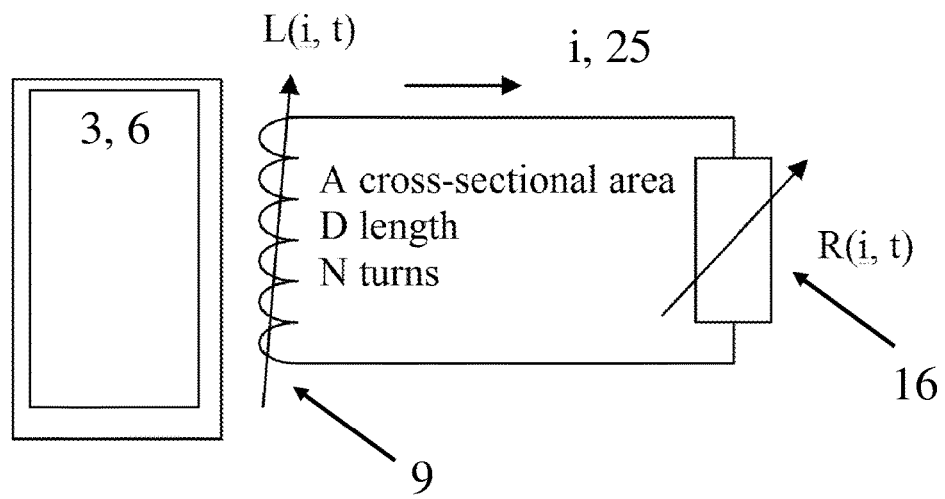

FIG. 15 shows the circuit for the Non Linear Method.

Figure 16:
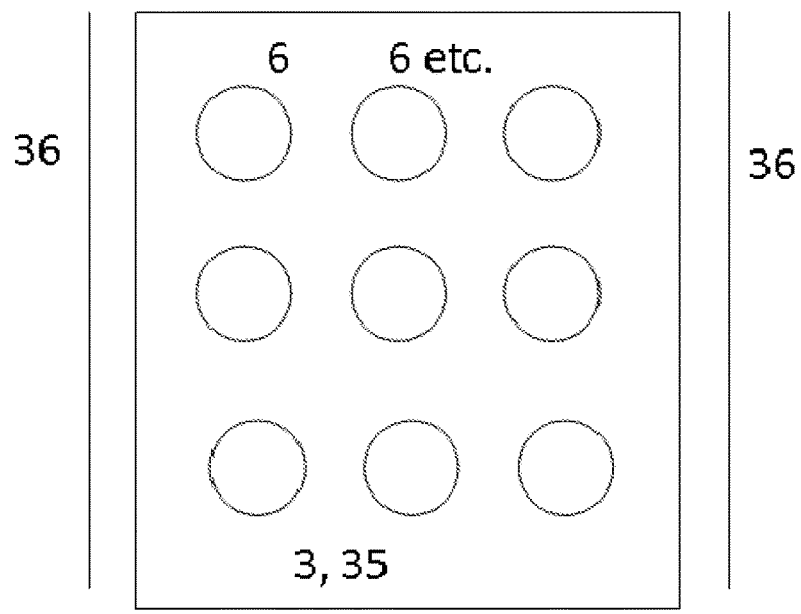

FIG. 16 shows an embodiment of the electrostatic temporary remanence device as a schematic showing the plates 36, the electrostatic working substance 3, the electrostatic co-material 35 and the non-conductive co-magnetic 6 embedded as a plurality of preferably small entities with preferably high anisotropy in the direction of the transient magnetic field.

Figure 17:
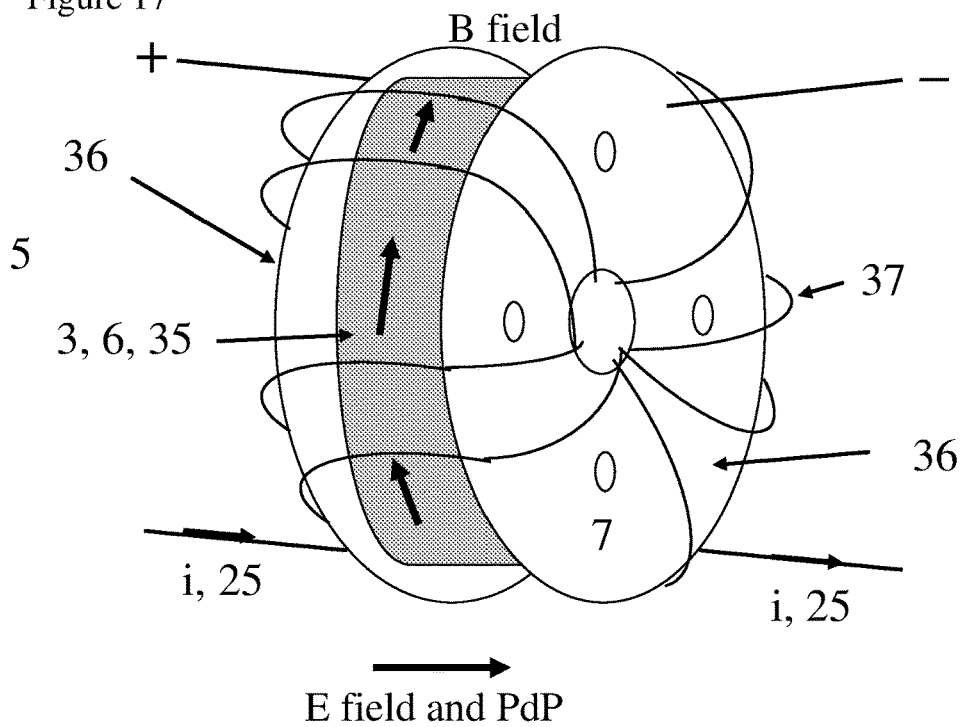

FIG. 17 shows the an embodiment of the electrostatic temporary remanence device as a capacitor with power take off by magnetic power coils 37, the magnetic co-material 6, the electrostatic co-material 35 and heat conduction channels 7.

Figure 18:
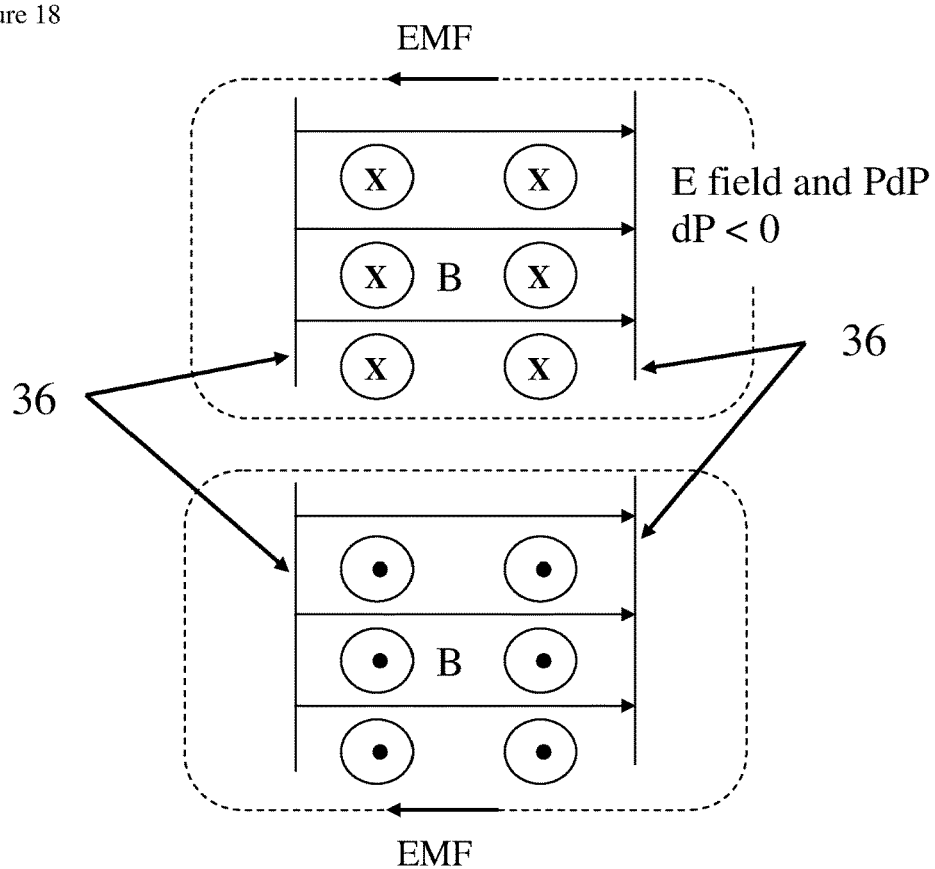

FIG. 18 shows the electric and magnetic fields associated with the electrostatic temporary remanence device as a capacitor. The device has heat conduction holes 7 and power coil windings 37.

Appendix 1 contains the MatLab computer simulation code for the magnetic temporary remanence device state equations.

DETAILED DESCRIPTION

Figure 1:
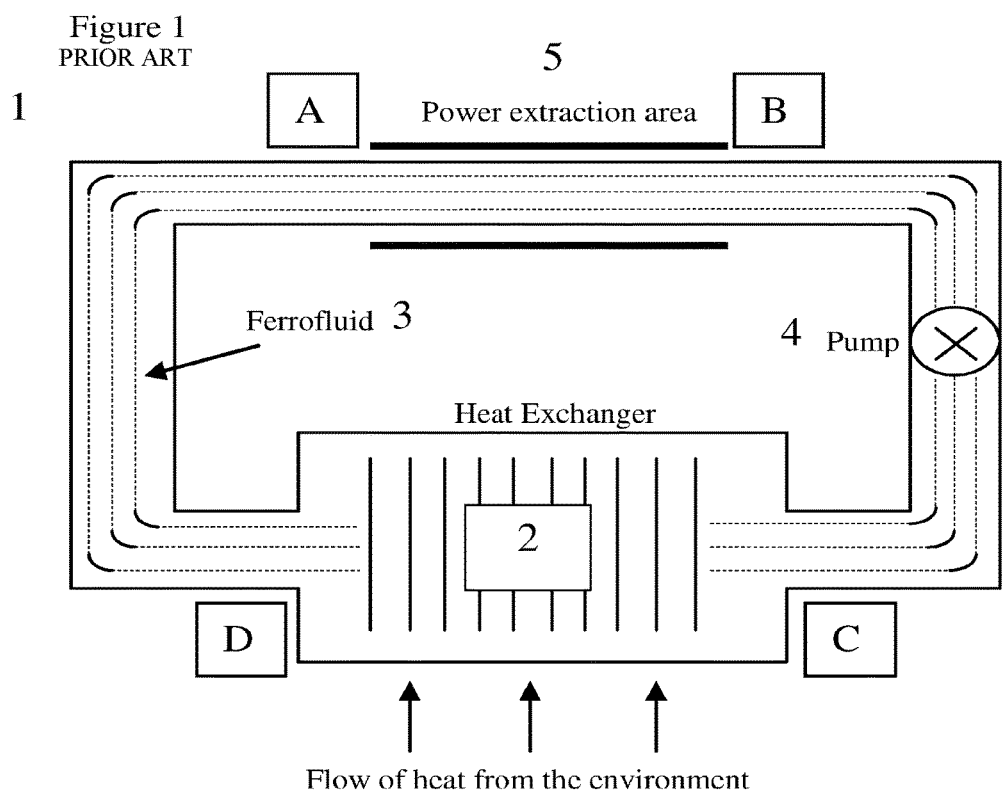

This document concerns improvements to a method of generating electricity given by the plant diagram 1 in FIG. 1. Heat energy from the environment via an heat exchanger 2 (between C and D) and heats a working substance 3 which is pumped 4 around a circuit to the power extraction area 5 (between A and B). In region 5, the working substance performs dipole work, generates electricity and cools. The cycle then continues via the pump 4 to the heat exchanger 2.

Figure 2:
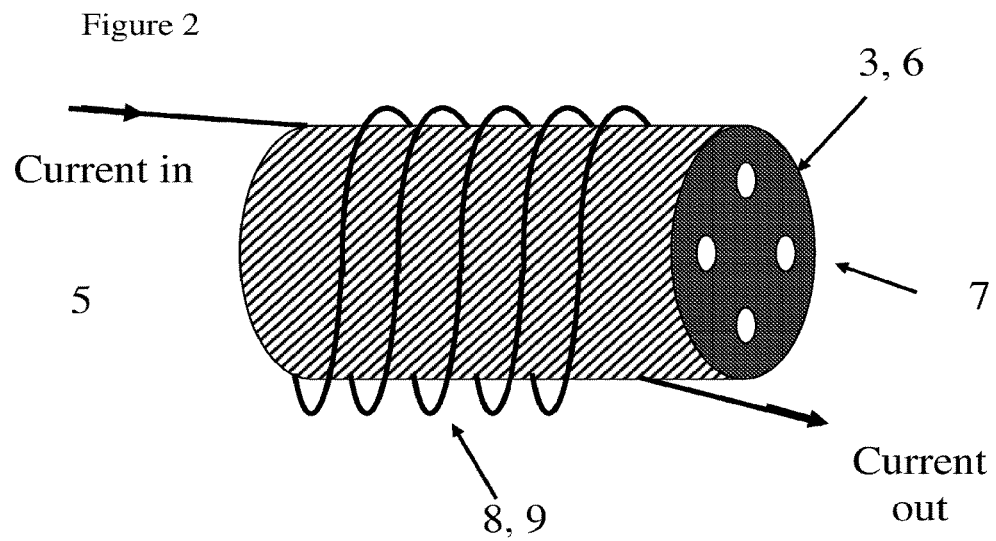

The power extraction area has the working substance 3 in a typical configuration given in FIG. 2 of the working substance and magnetic co-material 6, which boosts the susceptibility. If it is desired to have a solid working substance, heat conduction channels 7 are drilled or otherwise formed through it to allow heat transfer fluid to execute the circuit ABCD given in FIG. 1, instead of the working fluid itself. Around the power extraction area 5 are magnetizing coils 8 and power output coils 9.

With reference to FIG. 13A, we shall see later that additional coils such as the flyback coil 30 for the Field Cancellation Method are placed around the same former and discussion of this is left until later.

Figure 3:
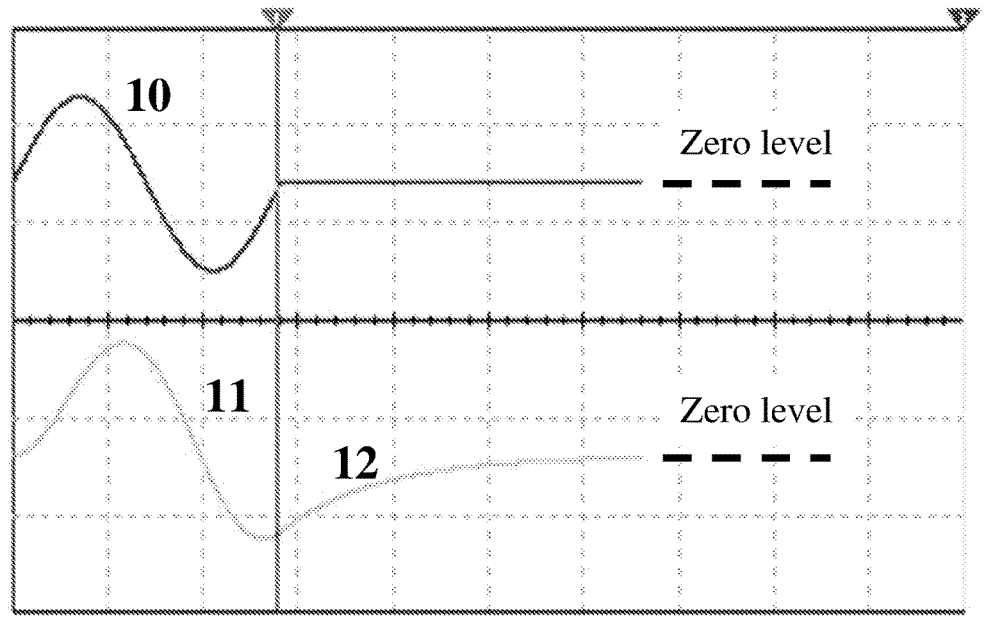

With reference to FIG. 3, the basic cycle consists of a magnetization phase where magnetizing coils are energised to provide a substantially unipolar or bipolar sinusoidal or half sawtoothed or pulse varying field 10, thus producing a substantially unipolar or bipolar sinusoidal or half sawtoothed electric flux 11 in the working substance 3. The form of the field 10 can be singular pulses or a pulsetrain of the said pulses.

Figure 4:
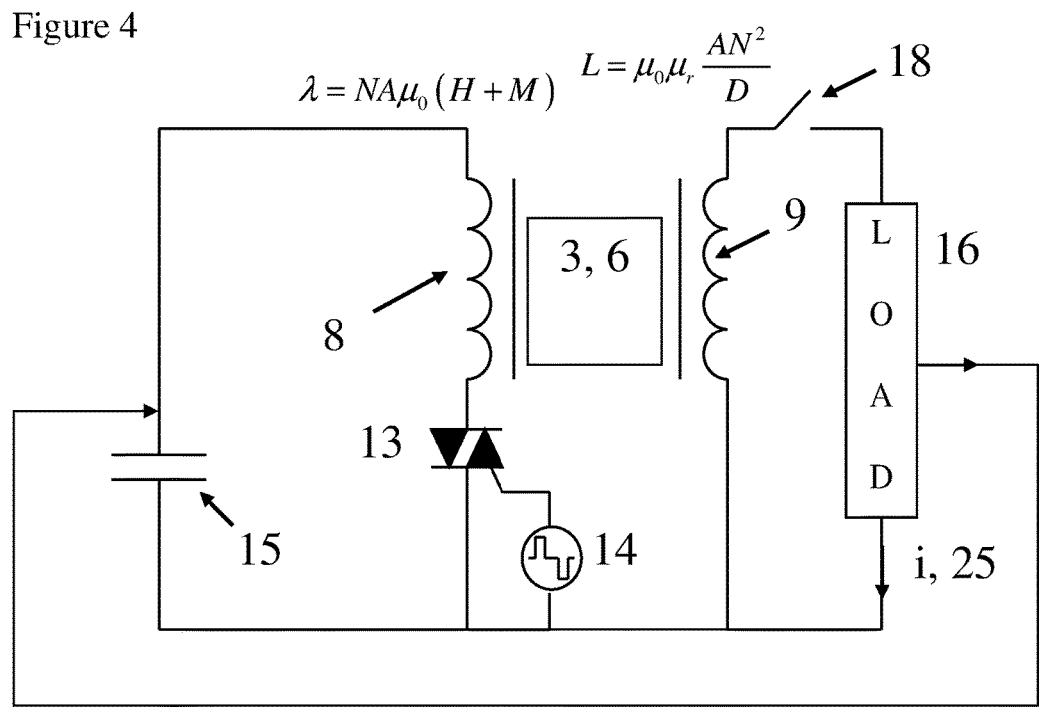

With reference to FIG. 4, the second half of the cycle results in the excitation field being substantially off. A temporary remnant flux 12 (shown in FIG. 3) results in the working substance 3 which is amenable to dipole-work that will directly convert heat energy into electricity via the power output circuit elements 9, 16, 18 and 25. The switch 18 is only closed when the excitation waveform 10 (shown in FIG. 3) is zero to avoid transformer action and wasting of the power in the excitation circuit, which runs in an efficient, recuperative manner.

In this section we explain a temporal phenomenon that seems to limit the dipole-work to being under the supplied magnetization energy if the load resistance is only linear; the implication being that a non-linear impedance will allow the dipole-work to exceed the magnetization energy input or by some other method (the Field Cancellation Method).

The Electrical State Equations for the Magnetic Temporary Remanence Cycle

A mathematical model can be constructed for the working substance and electrical output circuit. Let us first consider the ferrofluid flux decaying into a linear resistor.

Reference FIG. 4 (and the description text earlier) elements 3, 6, 9, 16, 18 and 25:

The flux linkage is given by ($\mu_r$ is the relative permeability):

$$\lambda = NAB \Rightarrow NA\mu_0\mu_r(H+M) \qquad \text{eqn. 1}$$

The magnetic field is given by:

$$H = \frac{N}{D}i \qquad \text{eqn. 2}$$

Figure 5:
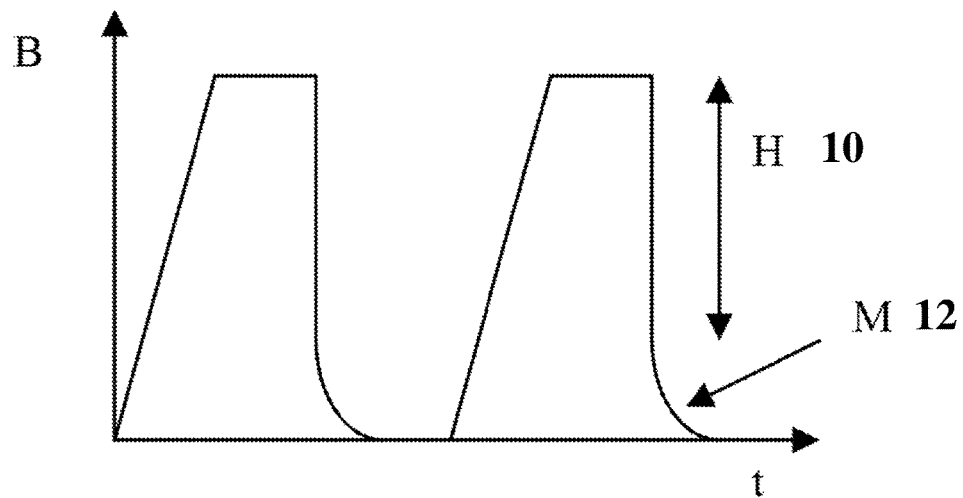

(reference is also made FIGS. 3 and 5)

Where i is the current through the coil, N is the number of turns and D is the length. The ferrofluid or superparamagnetic material in general obeys a $1^{st}$ order equation and implicit in this is the convolution of the H field 10 with magnetization M 11, 12. Advantageously, the H field 10 is switched on slowly relative to the relaxation rate of the working substance 3 so that dissipative processes are minimised:

$$\frac{dM}{dt} = -\frac{1}{\tau}(M - \chi\mu_r H) \qquad \text{eqn. 3}$$

That is, the rate of change of the magnetization is negatively proportional to the existing magnetization minus the driving contribution of the magnetic field (boosted by the susceptibility x and permeability of the co-material 6 $\mu_r$), thus when H is substituted, the following is obtained:

$$\frac{dM}{dt} = -\frac{1}{\tau}\left(M - \chi\mu_r\frac{N}{D}i\right) \qquad \text{eqn. 4}$$

The LR circuit 9, 16, 18, on analysis considering the voltages yields the following, another state space equation:

$$-\frac{d\lambda}{dt} - iR = 0 \Rightarrow -\lambda_M - \lambda_H - iR = 0 \qquad \text{eqn. 5}$$

$$\Rightarrow -\mu_0\mu_r AN\frac{dM}{dt} - \mu_0\mu_r\frac{AN^2}{D}\frac{di}{dt} - iR = 0$$

$$\therefore \frac{di}{dt} = -\frac{D}{\mu_0\mu_r AN^2}\left(\mu_0\mu_r AN\frac{dM}{dt} + iR\right)$$

Or substituting $$\frac{dM}{dt}$$

from eqn. 4, $$\frac{di}{dt} = \frac{D}{N\tau}M - \left(\frac{\chi\mu_r}{\tau} + \frac{DR}{\mu_0\mu_r AN^2}\right)i \qquad \text{eqn. 6}$$

Figure 7:
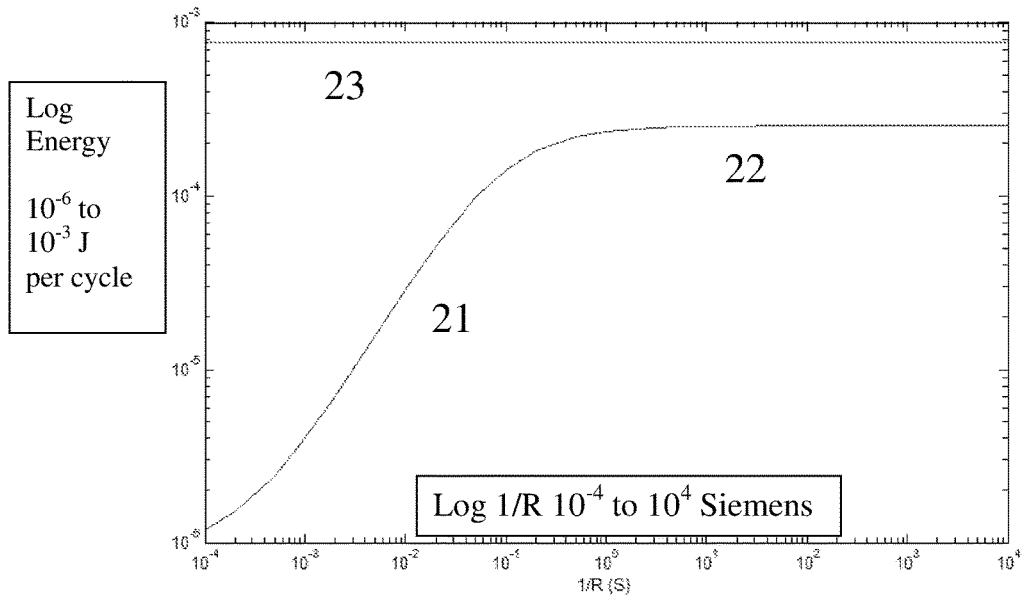
Figure 7:
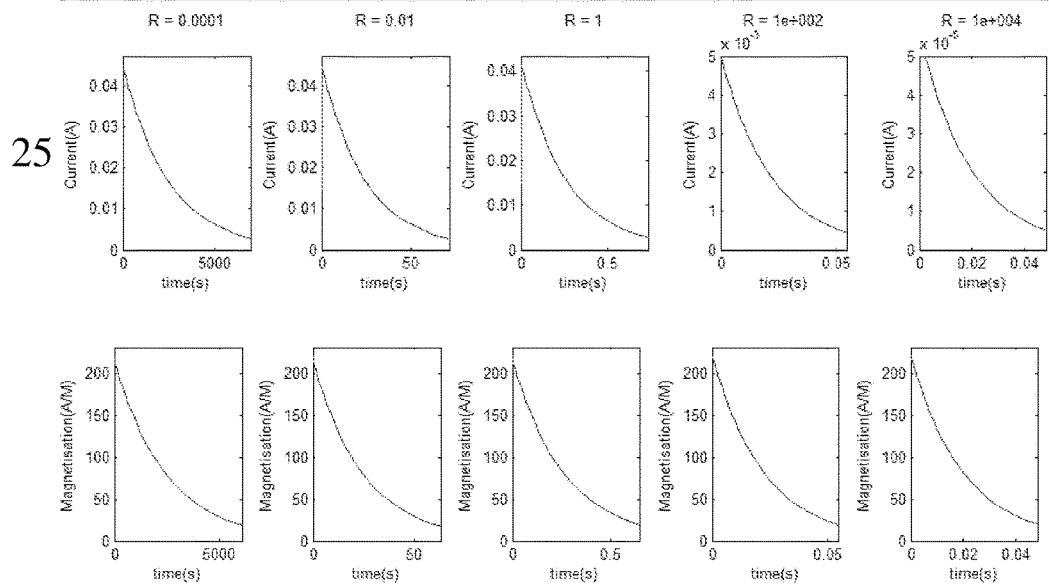

With reference to FIG. 7, the two equations eqn. 4 and eqn. 6 are suitable for coding on a digital computer and FIG. 7 shows typical output from Matlab code (reference appendix 1, the parameters are at the start of the simulation code). The energy delivered to the load 16 per cycle by the dipole work 21, 22 is shown versus 1/R. We can see that there is a linear Faraday Law portion 21 where the energy is proportional to:

$$W_{dw} = \int_0^\infty \frac{\left(\frac{d\lambda}{dt}\right)^2}{R} dt \qquad \text{eqn. 7}$$

Figure 6:
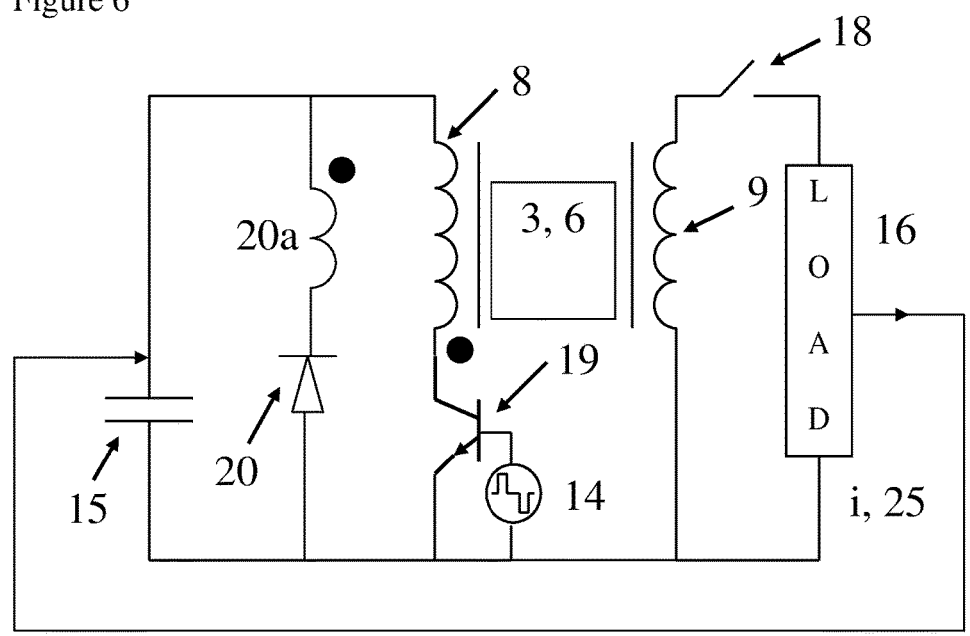

A simple electrical load only returns part of the magnetization energy 23 and that dipole work plateaus 22. We shall investigate this with the following theory:

With reference to FIG. 6, simulation and experiment have found that a simple resistive load always returns less energy than the magnetization energy input 23. The work done magnetizing is given by: ∫H·dB·dV of which the "H" field energy is discarded, as this can be returned with total efficiency if done by a mechanical magnetization process or very nearly so with an electronic process (FIG. 6) 8, 14, 15, 19, 20 and 20a, leaving:

$$\int_{M \cdot V} \mu_0 \mu_r H \, dM \cdot dV = \mu_0 HM'V$$

The integrand has been resolved with the relative permeability of the co-material 6 in close proximity to the working substance subsumed into M'. We can further write the integrand by M'=μXH as (dropping the primes):

$$E_{mag} = \frac{\mu_0}{\chi\mu_r} M^2 V \qquad \text{eqn. 8}$$

With reference to the lower figures in FIG. 7, we shall now show that the lower returned dipole-work is due to the phenomenon of the slowing of the current waveform 25: Taking the Laplace Transform of eqn. 4 and eqn. 6 and the set solved for I(s) in the s-domain to yields $$\left(\text{with } L = \frac{\mu_0 AN^2}{D}\right), \qquad \text{eqn. 9}$$

-continued $$I(s) = \frac{\frac{DM_0}{N}}{s^2 \tau_{ferro} + s\left(\frac{R}{L}\tau_{ferro} + (1 + \mu_r \chi)\right) + \frac{R}{L}}$$

The dominant pole near the origin sets the dynamics, and a binomial series expansion of the roots of the denominator gives:

$$as^2 + bs + c =$$

$$0 \Rightarrow s \cong -\frac{b}{2a} \pm \frac{b}{2a}\left(1 + \frac{1}{2}\left(\frac{-4ac}{b^2}\right) + \frac{1}{2} \cdot -\frac{1}{2} \cdot \frac{1}{2!} \cdot \left(\frac{-4ac}{b^2}\right)^2 + O(n^3)\right)$$

The dominant pole gives the response:

$$s \cong \frac{c}{b} \Rightarrow -\frac{1}{\tau'_{ferro}} = -\frac{1}{\tau_{ferro} + \frac{L(1+\mu_r\chi)}{R}} \qquad \text{eqn. 10}$$

Thus $$\tau'_{ferro} = \tau_{ferro} + \frac{L(1+\mu_r\chi)}{R} \Rightarrow \tau_{ferro}\bigg|_{R \to 0} \to \tau_{elec}$$

the 2$^{nd}$ term is a purely electrical circuit effect (inductor-resistor circuit) which dominates at high loading (R→0). The current 25 induced into the power output coils 9 is then:
The electrical work delivered to the load is:

$$\int_0^\infty i^2(t) R \, dt$$

by which we can calculate the work as the time constant stretches to infinity (the plateau 22 of the dipole-work on FIG. 7):

$$W_{dw \cdot L/R \to \infty} = \frac{1}{2} \frac{\mu_0}{(1 + \chi\mu_r)} M^2 V \qquad \text{eqn. 12}$$

This expression for the ultimate simple dipole-work, eqn. 12 is seen to be less than the magnetization energy eqn. 8.
The "H-Field Cancellation" Method Reference FIGS. 8, 9A, 9A, 9C, 10A, 10B, 11A, 11B, 11C, 12, 13A and 13B and the description texts earlier.

In the previous section it was shown that a resistive electrical load 16 on its own only returned part of the input magnetization work. What was manifest was a slowing in the time constant (FIG. 7, lower figures) of the induced current 25 waveform. Heuristically this effect arises due to the re-magnetization term Xμ,H in eqn. 3, as without it the ferrofluid would relax at its native rate. This is shown underlined below:

$$\frac{dM}{dt} = -\frac{1}{\tau}(M - \underline{\chi\mu_r H})$$

The technique is to provide a cancelling magnetic field that has no effect on the ferrofluid or the power extraction circuit and this is depicted in FIGS. 8 and 9. If the re-magnetization term is removed (or cancelled) then the energy per cycle curve depicted in FIG. 8 results. It can be seen that the curve 24 by this method exceeds the magnetization energy 23 and the energy returned into a simple resistive load 22.

Essentially what occurs is that the current 25 in the output power coil 9 re-magnetizes the working substance 3 and co-material 6 and slows the current waveform (FIG. 7, lower figures). By generating an opposing field, this term can be neutralized by another coil 8 (FIG. 13A or use of the same magnetization coil in step 1 of the cycle) around the power extraction area 5.

It is not a simple matter of just supplying an opposite field as a null-transformer will result. We shall discuss this shortly in the next section looking at the electrical analysis. Essentially, a superimposed field around the working substance needs to be created, that is of such high frequency, that it is averaged to substantially zero by the slow relaxation rate of the working substance 3.

FIG. 9A shows how the current 25 is copied, inverted and chopped by a high frequency signal. This copy current produces its own field and this sums with the field produced by the current 25 to result in FIG. 9B. The working substance largely filters the resulting chopped re-magnetizing field to a much lower magnitude (last legend in FIG. 9B). The chopping process results in the cancelling field includes periods corresponding to the zero regions in the inverted current, which are separated from each other by a time period which is less than the relaxation time of the sample, and preferably by a time period which is one third or less than the relaxation time of the sample.

FIG. 9C shows an even better method that uses an asymmetric principle of copying a multiple (×1.5) of the current 25 (or more turns on the former to produce a bigger field) and a higher chopping frequency. The final figure in the legend shows that the re-magnetizing field is virtually eliminated by the technique.

Comparing the current and magnetization vs. time traces in the lower figures of FIGS. 7 and 8, we can see that both the current and magnetization traces are speeded up by the method (FIG. 8), compared to the dipole-work into a simple electrical load (FIG. 7).

With reference to FIGS. 10A and B, another way of viewing the technique can be seen in the frequency domain. The re-magnetizing field from the current is shown in the first legend FIG. 10 in the frequency domain. This current is copied and inverted in the next legend and the chopping produces harmonics, as per the modulation theorem:

$$\sin A \cdot \sin B = \tfrac{1}{2}\cos(A-B) - \tfrac{1}{2}\cos(A+B) \qquad \text{eqn. 13}$$

The lowest legend represents the superposition of the field from the current 25 and the field from the cancellation current 26. It can be seen that the low frequency component, that the working substance 3 would respond to, is obliterated. In FIG. 10B, we can see how the frequency response of the field cancellation circuit (FIG. 13A) and the working substance 3 and power output circuit respond to the low frequency power signal and high frequency components of the cancellation signal: in the first case, the power signal does not interfere with the cancellation circuit and in the second case, the cancellation signal is filtered out.

The Electrical Circuit and Electrical Analysis of the Work Required by the H-Field Cancellation Circuit With reference to FIGS. 11A, B, C and 13A and B, the cancellation circuit can be implemented by a current mirror 32 which is switched on and off rapidly by an high frequency clock signal 33. The current 26 resulting can impinge on the working substance 3 and co-material 6 by the same excitation field coils 8 or another coil. A flyback circuit 30, 31 recoups the field energy used in the chopping process and returns it to storage capacitor 29. The chopping process will have some losses, so periodically the capacitor 29 is charged via switch 28 from a high voltage source 27. Ultimately all the power needs of this circuit comes from the power generated by the working substance 3 and co-material 6 and the power output circuit.

We proceed to analyse the energetics of the scheme by the equivalent circuit of a null transformer (FIG. 11A), that is, a transformer with two windings in intimate contact with equal and opposite currents flowing through the windings. The result is that there is obviously no effect in this case and by deviating from the arrangement, we show the validity of the cancellation method.

The sense of the currents and voltages from the self and mutual inductances and the decaying ferrofluid (working substance 3 and co-material 6) flux, $$V_{ff} = -\frac{d\lambda_{ff}}{d}$$

is shown. It is quite clear that the LHS current mirror does work against the decaying ferrofluid flux and this is of course at least equal to the work that is supposed to be delivered onto the RHS into the load. It is obvious that no power is delivered to the load. Another way of putting this is, of course, that it is a null transformer with changes in magnetic field excluded from the coils' interior. Another way, still, is to note that the current in the LHS circuit is equal and opposite to the RHS and that this is induced into the RHS circuit nullifying all current.

Figure 11B:
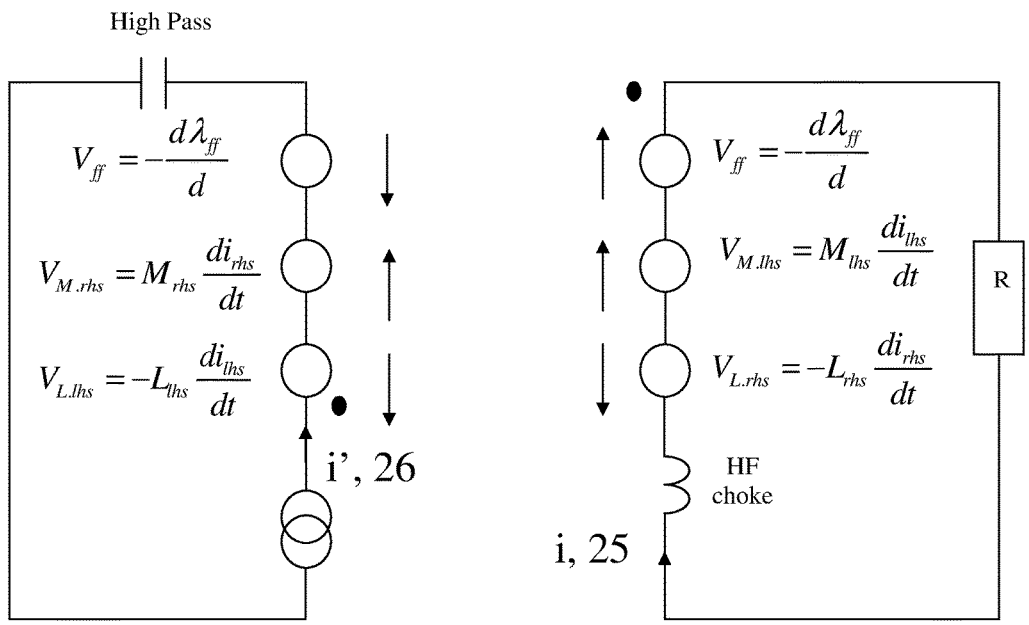

Next we note the addition of the filtering circuit elements, the high pass (and storage capacitor) on the LHS and the high frequency inductor (hf choke) on the RHS in FIG. 11B. Now the situation is different: Firstly the high frequency series inductor (or "choke") blocks the high frequency chopped current from the LHS being induced into the RHS and the "high pass" capacitor blocks the low frequency current from the RHS being induced in LHS.

This can be understood by a simple potential divider effect (FIG. 11C): In the left-hand figure, the dynamic impedance of the current source is represented by $R_{CS}$. It is a simple matter to find the voltage across the current source induced by the changing ferrofluid flux and deduce that with a relatively low rate of change of ferrofluid flux, with a small capacitance 29 (FIG. 13A), very little voltage and hence work is done against the current source.

$$V_{R_{CS}} = V_{ff}\left(\frac{R_{CS}}{\dfrac{1}{j\omega C_{HP}} + R_{CS}}\right) \qquad \text{eqn. 14}$$

The current 26 in the LHS circuit is set-up by the current mirror 32 (FIG. 13A) and this can be a fraction of the current on the RHS (FIG. 13B), all that matters is that the turns-ratio of the coil is sufficient to cancel the H-field from the RHS circuit. In the limit of small current, it is obvious that the electrical work performed by the changing ferrofluid flux is less than that performed on the RHS circuit.

Further to the argument, the current source mainly performs electrical work establishing the cancellation magnetic field on the LHS. This can be recouped with high efficiency by a "flyback" circuit 30, 31 (FIG. 13A). The current source performs net work against the electrical resistance of the left-hand circuit and this can be made arbitrarily small, in fact to labor the point, a fractional current mirror (FIG. 13B) can be used (since all that matters is the current multiplied by the left-hand turns to establish the cancelling field) and this makes it even more obvious.

Figure 11C:
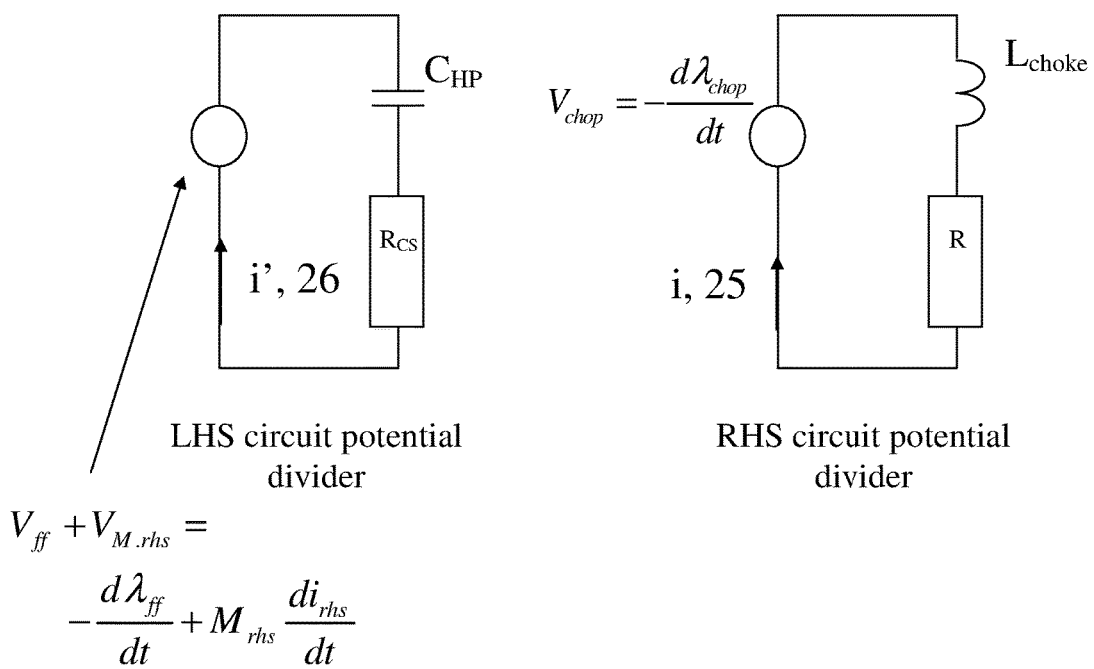

Considering now the work of the chopping circuit on the right-hand power output circuit (FIG. 13A), in FIG. 11C we can see a similar potential divider effect:

$$V_R = V_{chop}\left(\frac{R}{j\omega L_{choke} + R}\right)$$

This time we note that, the high frequency chopping field results in an high impedance from the choke 34; very little electrical work is thus expended by the chopping circuit on the power output circuit.

1.1.1. Dynamic Analysis of the H-Field Cancellation Method and the Ultimate Electrical Work We now follow the same procedure with the state equations of eqn. 3, eqn. 4 and eqn. 6 but with the re-magnetizing H-field removed from equation 3, to yield the transform of the induced current 25:

$$I(s) = \frac{\frac{DM_0}{N}}{s^2 \tau_{ferro} + s\frac{R}{L}\tau_{ferro} + \frac{R}{L}} \qquad \text{eqn. 15}$$

Whereupon the current in the time domain by the dominant pole is:

$$i(t) = \frac{DM_0}{N}e^{-t/\tau'_{ferro}} = \frac{DM_0}{N}e^{-tR/L} \qquad \text{eqn. 16}$$

The dipole-work by the cancellation method in the limit is obtained, once again, by $$\int_0^\infty i^2(t)R dt.$$

$$W_{dw\cdot cancel\cdot L/R \to \infty} \frac{1}{2}\mu_0 M^2 V \qquad \text{eqn. 17}$$

This is seen to be the magnetic field energy of the ferrofluid flux (the plateau 24, FIG. 8).

The cancellation method has been proven in experiment and simulation (appendix 1) in the first instance by the simple expedient of zeroing the re-magnetization term:

```
%#################################################
dMdt = (1./tor) .* fac .* ( M - 0.*H.*Xchi.*CONST_perm );
```

The results are displayed in FIG. 8. Straightaway, logically, one can see the effect of the ferrofluid relaxing at its native rate in FIG. 8, lower traces, compared to FIG. 7, lower traces.

A more physical simulation, other than the "trick" of zeroing the H-field is implemented at the end of appendix 1 by a high frequency cancellation H-field:

```
%#################################################
dMdt = -(1./tor) .* fac .* ( M - H.*(1-Cancel(t)) ...
    .*Xchi.*CONST_perm);
...
function field = Cancel(t)
   % Generate square waveform 0-1.5 at frequency "freq"
   freq = 20000; % freq = 100/tor;
   field = 1.5.*(0.5+0.5.*sign(0.5+freq.*t-round(freq.*t+0.5)));
end
```

Though this code is much slower to run due to the fine time-scale needed to simulate the cancellation field and the potentially long time scale of the electrical circuit.

With reference to FIG. 12, comparison is now made to the plateau limit ratios (FIG. 8) of equations eqn. 8, eqn. 12 and eqn. 17, that is:

$$\frac{1}{\chi\mu_r} : \frac{1}{2(1+\chi\mu_r)} : \frac{1}{2}$$

with variation of the parameter Xμ, which is the effective susceptibility of the ferrofluid/working substance 3 with the high permeability co-material 6 present and this is plotted in FIG. 12. For all variation of parameters, the magnetization energy is always greater than the dipole-work without the cancellation method. However if Xμ>2 the dipole-work, with the cancellation method, will exceed the magnetization energy input.

The power produced by the device is then:

$$P = (W_{dw\cdot cancel} - E_{mag} - W_{losses})F_{cycle} \qquad \text{eqn. 18}$$

Method of Excess Power by Non-Linear Impedances

Reference is made to FIGS. 7, 14A, B, C and D and 15.

FIG. 4 shows an improvement to the basic setup of FIG. 2. The main feature is a variable turns ratio for the output coil and variable resistance for the output resistance. These impedances are functions of current and time and are under computer control for the duration of the power cycle.

The first problem we shall address is the electrical time constant dominating and swamping the quicker time constant of the ferrofluid. As has been seen in the linear case, we aim for low output impedances (which can always be matched to a load or the load is just used as a heating element for a conventional Carnot cycle) as these obtain the most energy on each cycle, however they are the slowest (FIG. 7 upper and lower legends).

The first method is, under computer control for the computer to vary the turns ratio of the output coil and the output resistance. This method is able to achieve the highest energy returned from the decaying ferrofluid in a finite time scale. FIG. 7, lower legend shows the linear case and the lowest resistances give the highest returned energy but the leftmost traces show incredibly long time constants; we cannot start another cycle until this cycle complete and this implies that the power output from the device is low. Immediately this suggests a constrain condition:

$$\frac{L(i,t)}{R(i,t)} \leq K_1 \tau_{ferro} \qquad \text{eqn. 19}$$

$$\Rightarrow R(i,t) \geq \frac{\mu_0 \mu_r \dfrac{AN^2(i,t)}{D}}{K_1 \tau_{ferro}}$$

The inductance has been expanded into a well-known form for the inductance of a long solenoid.

Another constraint can be found from adjusting the rate of non-linear power output (just EMF²/R) to be greater than the linear case magnetizing the ferrofluid as a baseline.

$$\mu_0^2 A^2 \frac{N^2(i,t)}{R(i,t)} \left(\frac{dM}{dt}\right)^2 = K_2 E_{mag} \frac{t}{K_3 \tau} \qquad \text{eqn. 20}$$

Where the constants $K_2$ is a multiple of the magnetizing energy and $K_3$ is the time scale of linear magnetization (the ferrofluid is switched on slower than its 3-dB point so that needless dissipation doesn't occur. $K_3$ works out about 3).

Into eqn. 20 is substituted eqn. 3 and we solve this for R(i,t) which is then substituted into inequality eqn. 19 leading to eventually:

$$N(i,t) \leq \left[ M(t) \pm \sqrt{\frac{K_2 E_{mag} t}{\mu_0 \mu_r K_1 K_3 \tau_{ferro}^2}} \right] \frac{D}{\chi \mu_r i(t)} \qquad \text{eqn. 21}$$

Overall the solutions for N(i,t) and R(i,t) are constrained (physically) as:

$i \in \mathbb{R}$ $t \in \mathbb{R}^+$ $t$ is monotonically increasing $R(i,t) \in \mathbb{R}^+$ $N(i,t) \in \mathbb{N}^+$ $K > 1$ With the conditions:

FIGS. 14A, B, C and D show the results of a simulation and specifically the parameters $K_1=5$, $K_2=3$ and $K_3=3$ and is able to achieve non-linear dipole work tending to the linear case in finite time; observe FIG. 14D and we see that the current waveform is only about ten times slower than the ferrofluid magnetization waveform and this, itself, is hardly changed from the no load value (when R co). FIG. 15 gives a circuit schematic.

Device Based on Electrical Remanence

Reference is made to FIGS. 1, 15, 16, 17 and 18 (and the description text earlier).

In constructing the electrostatic dual of the temporary remanence cycle, there are subtle similarities and differences. Both involve a charging and discharging phase: one with magnetic flux and an energy cost of the magnetizing energy, the other electric or polarization flux and the energy cost of polarization energy. Both too would seem to have a "lossy" tank where this input energy is converted to internal energy ("heat") at the rate a function of:

$$\frac{d\phi}{dt} = -\frac{\phi}{\tau}.$$

However, as we saw with the magnetic system:

$$\frac{dM}{dt} = -\frac{1}{\tau}(M - \chi \mu_r H) \qquad \text{(eqn. 4)}$$

$$\Rightarrow \frac{dM}{dt} = -\frac{1}{\tau}\left(M - \chi \mu_r \frac{N}{D} i\right)$$

And $$-\frac{d\lambda}{dt} - iR = 0 \qquad \text{(used to derive eqn. 6)}$$

The re-magnetizing field is in the same sense (if one can imagine the entry and exit wires of the solenoid as parallel to the axial field) as the current and original magnetizing field; furthermore, this re-magnetizing field can be cancelled by the field cancellation method to leave, via eqn. 5, a means of getting dipole work that exceeds the input energy cost; the difference in the two is the thermal energy converted (see Cornwall's thesis).

Eqn. 5 comes directly from the $2^{nd}$ Maxwell/Faraday's Law equation in integral form, which is then equated to the potential drop across the resistor. No such law exists in the electrostatic case regarding the flux and discharge and this always leads to the return of the electrostatic field energy ½$\epsilon_o$EdE·dV and polarization energy EdP·dV (from EdD·dV):

From the $1^{st}$ Maxwell equation/Gauss' Law:

$$\nabla \cdot \left(E + \frac{P}{\varepsilon_0}\right) = \frac{\rho_{free}}{\varepsilon_0} \qquad \text{eqn. 22}$$

And hence, $$\oiint \left(E + \frac{P}{\varepsilon_0}\right) \cdot dA = \frac{Q_{free}}{\varepsilon_0} \qquad \text{eqn. 23}$$

This represents a combination of the electric field at the plates of the capacitor and the electric field from the polarization. The movement of the free charges is the circuit current, thus:

$$A\left(\frac{dE}{dt} + \frac{1}{\varepsilon_0}\frac{dP}{dt}\right) = \frac{1}{\varepsilon_0}\frac{di}{dt} \qquad \text{eqn. 24}$$

Multiplying both sides the voltage across the plates, i.e.

$$v = \int_d E \cdot dl$$

yields, $$Ed \cdot A\left(\frac{dE}{dt} + \frac{1}{\varepsilon_0}\frac{dP}{dt}\right) = \frac{1}{\varepsilon_0} v \frac{di}{dt}$$

Which upon integration w·r·t. time, $$\Rightarrow (\epsilon_0 E dE + E dP) V \ vi \qquad \text{eqn. 25}$$

This is just seen to be the differential electrostatic work EdD and the instantaneous electrical power.

We also note in this case too, that the first state equation becomes:

$$\frac{dP}{dt} = -\frac{1}{\tau}(P - \chi \varepsilon_0 \varepsilon_r E) \qquad \text{eqn. 26}$$

No de-polarization cancelling method can be made to strike out the term $X\epsilon_o\epsilon_r E$, when we realize that the potential across the load resistor is negative and acts to increase the rate of decay further. This only reflects energy leaving the capacitor "tank" (in competition to that being converted to heat), as it should.

The power extraction area 5 can be implemented with the electrical dual of magnetism, electrostatics. By the $4^{th}$ Maxwell equation, the changing electrical field from the temporary polarization creates a temporary magnetic field. This then amounts immediately to an analogous situation with the magnetic device and a further embodiment (FIG. 18). The input electrostatic and polarization energy then becomes magnetization energy and the field cancellation method then applies, to net the difference between magnetostatic energy and the magnetization energy as thermal work converted. Let us explore this:

Where P is the polarization and E is the electric field strength. The electrically polarizable working substance 3 can have its electrical susceptibility x increased with electrically polarizable co-material 35 (FIGS. 16, 17) whose relaxation rate is substantially faster than the relaxation rate of the working substance. We shall see shortly that it is advantageous to have an electrically non-conducting magnetic co-material 6 too.

From the definition of electrical polarization by the first Maxwell equation as being the electric field (E-field) produced by bound charges, we can write:

$$\nabla \cdot \left(\frac{\rho_{bound}}{\varepsilon_0} + E_{temp}\right) = \frac{\rho_{free}}{\varepsilon_0} \qquad \text{eqn. 27}$$

Note that the electric field has two components: The E-field from the polarization and the E-field which results from the displacement current, $E_{temp}$.

Let us consider $E_{temp}$ first. The fourth Maxwell equation includes the displacement current term. We are considering a dielectric so the current density term is left out:

$$c^2 \nabla \times B = \frac{\partial E}{\partial t} \qquad \text{eqn. 28}$$

The electric field results from the polarization along the x-axis, which is the axis of the capacitor, so we can write:

$$c^2 \nabla \times B = \varepsilon_0 \varepsilon_r \chi \frac{\partial P_x}{\partial t} i \qquad \text{eqn. 29}$$

Thus the curl operator can only have components in the yz plane:

$$\nabla \times B = \begin{vmatrix} i & j & k \\ \frac{\partial}{\partial x} & \frac{\partial}{\partial y} & \frac{\partial}{\partial z} \\ B_x & B_y & B_z \end{vmatrix} \qquad \text{eqn. 30}$$

For simplicity we shall consider cylindrical symmetry and we know that the B-field will circulate around the changing $P_x$ vector. Using Stoke's Identity to relate the line integral of the curl of B to the surface integral of the flux from P, we find:

$$c^2 \int_0^r B \cdot d(2\pi l) = \int_0^r \varepsilon_0 \varepsilon_r \chi \frac{\partial P_x}{\partial t} \cdot d(\pi l^2)$$

Thus the temporary independent magnetic flux is:

$$B_{yz}(t) = \varepsilon_0 \varepsilon_r \chi \frac{r}{c^2} \frac{\partial P_x(t)}{\partial t} \qquad \text{eqn. 31}$$

This B-field is itself changing and will lead to $E_{temp}$ and so on, as a series in powers of $1/c^2$, so we safely truncate it to first order in $1/c^2$. The E-field is given by Maxwell's $2^{nd}$ equation:

$$\nabla \times E_{temp} = -\frac{\partial B_{yz}(t)}{\partial t} \qquad \text{eqn. 32}$$

Which we know from Stoke's Identity will lead to an E-field perpendicular to the plane yz, that is, in the anti-x axis direction ( $$\frac{dP}{dt}$$

is negative), increasing with magnitude with the radius (that is, our line integral path is an axially aligned loop through the centre of the capacitor, see FIG. 18):

$$v_{temp} = \oint_{path} E \cdot dl = -\frac{\partial \lambda}{\partial t} \qquad \text{eqn. 33}$$

The path at the centre contributes nothing, so we can write (V is the volume, n is the turns per unit length):

$$v_{temp} = -(\mu_0 \mu_r n) V \frac{\varepsilon_0 \varepsilon_r \chi}{c^2} \frac{\partial^2 P_x(t)}{\partial t^2} \qquad \text{eqn. 34}$$

A further embodiment of this device is thus apparent and shown in FIG. 17. The factor [tom has been included to allow for the possibility of magnetic co-material 6 (which must be non-conductive, e.g. ferrite) to boost this field and multiple turns around the capacitor. All discussion of the H-field cancellation technique and non-linear methods discussed earlier pertain to this technique too.

Much the same argument as regards the magnetization field (FIG. 3) applies to the polarizing field as regards the wavetrain, the off period and the slow switch-on to minimize dissipative losses.

The non-linear approach can be applied too to this embodiment of the device by varying the load resistance (FIG. 17) as the polarizing flux decays or varying the capacitance with time by having plates 36 at further distances from the working substance.

The following claims include dependent claims which are not repeated for all of the independent claims. However, unless wherein it would be inconsistent, it should be understood that the features of any of the dependent claims may be combined with any of the independent claims.

When used in this specification and claims, the terms "comprises" and "comprising" and variations thereof mean that the specified features, steps or integers are included. The terms are not to be interpreted to exclude the presence of other features, steps or components.

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilized for realizing the invention in diverse forms thereof.

The invention claimed is:

1. An apparatus for performing a thermodynamic cycle, comprising: a sample that exhibits temporary magnetic remanence;
   a magnetisation arrangement to magnetise the sample during a first portion of the cycle; a power collection arrangement to generate electrical power due to a first magnetic field generated by the sample as a result of decay of independent magnetic flux during a second portion of the cycle;
   a field cancellation arrangement to cancel at least partially a second magnetic field generated by the sample during the second portion of the cycle, wherein the second magnetic field would tend to oppose, or decrease the rate of, demagnetisation of the sample;
   wherein the field cancellation arrangement produces a cancelling field to cancel at least partially the second magnetic field, and wherein the field cancellation arrangement comprises a current detector operable to detect current induced by the second magnetic field, and wherein the field cancellation arrangement is operable to produce the cancelling field based on the detected current.

2. An apparatus according to claim 1, wherein the first and second magnetic fields are components of the same overall magnetic field.

3. An apparatus according to claim 1, wherein the sample comprises a ferrofluid or a ferroset.

4. An apparatus according to claim 1, wherein the magnetisation arrangement comprises one or more first coils.

5. An apparatus according to claim 1, wherein the power collection arrangement comprises one or more power collection coils.

6. An apparatus according to claim 5, wherein the one or more power collection coils are configured to pass preferentially low frequency signals, and preferably wherein the one or more power collection coils are configured to pass preferentially signals having a period that is more than that of the relaxation time of the sample.

7. An apparatus according to claim 6, wherein the power collection arrangement comprises a processor, and the number of turns of the coil and/or the resistance of the load may be varied under the control of the processor.

8. An apparatus according to any preceding claim 1, wherein the field cancellation arrangement comprises one or more second coils.

9. An apparatus according to claim 8, wherein the magnetisation arrangement comprises one or more first coils and wherein the second coils are not the first coils.

10. An apparatus according to claim 9, wherein the field cancellation arrangement is operable to produce a cancelling field which is at least partly produced using an inverted version of the detected current, and preferably wherein the inverted version of the detected current is scaled by a scaling factor, and wherein the scaling factor may be more than one, so that the inverted version of the detected current is of a greater magnitude than the detected current, or less than one, so that the inverted version of the detected current is of a lesser magnitude than the detected current.

11. An apparatus according to claim 10, wherein the inverted version of the detected current is modified to include zero regions which are spaced apart from each other.

12. An apparatus according to claim 10, wherein the zero regions are spaced apart from each other so that, when the cancelling field is generated, the cancelling field includes periods corresponding to the zero regions which are separated from each other by a time period which is less than the relaxation time of the sample, and preferably by a time period which is one third or less than the relaxation time of the sample.

13. An apparatus according to 10, wherein the cancellation field is generated by passing the inverted version of the detected current through one or more cancellation coils.

14. An apparatus according to claim 9, wherein a flyback transformer is provided to generate at least partially a signal for generation of the cancellation field.

15. An apparatus according to claim 8, wherein the one or more field cancellation coils are configured to pass preferentially high frequency signals, and preferably wherein the one or more field cancellation coils are configured to pass preferentially signals having a period that is one third or less of the relaxation time of the sample.

16. An apparatus according to claim 1 wherein the magnetisation arrangement is operable to generate a magnetising field with a time profile having periods where the field is substantially zero, and wherein the magnetisation arrangement is operable to generate magnetic field with a time profile corresponding to a half-sawtooth or half-sinusoidal profile.

17. An apparatus according to claim 1, wherein the polarisation arrangement comprises a pair of electrically chargeable plates which are positioned on opposing sides of the sample.

18. An apparatus for performing a thermodynamic cycle, comprising: a sample that exhibits temporary electrical remanence;
   a co-material that exhibits temporary magnetic remanence, the co-material being placed in close proximity to the sample;
   a polarisation arrangement to polarise the sample during a first portion of the cycle; a power collection arrangement to generate electrical power due to a first magnetic field generated by the co-material as a result of decay of independent magnetic flux during a second portion of the cycle;
   a field cancellation arrangement to cancel at least partially a second magnetic field generated by the co-material during the second portion of the cycle, wherein the second magnetic field would tend to oppose, or decrease the rate of, demagnetisation of the co-material;

wherein the field cancellation arrangement produces a cancelling field to cancel at least partially the second magnetic field, and wherein the field cancellation arrangement comprises a current detector operable to detect currents induced by the second magnetic field, and wherein the field cancellation arrangement is operable to product the cancelling field based on the detected current.

* * * * *